(12) United States Patent
Sato

(10) Patent No.: US 11,069,702 B2
(45) Date of Patent: Jul. 20, 2021

(54) SEMICONDUCTOR DEVICE AND MANUFACTURING METHOD THEREOF

(71) Applicant: TOSHIBA MEMORY CORPORATION, Tokyo (JP)

(72) Inventor: Hiroyasu Sato, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 96 days.

(21) Appl. No.: 16/116,814

(22) Filed: Aug. 29, 2018

(65) Prior Publication Data

US 2019/0287992 A1 Sep. 19, 2019

(30) Foreign Application Priority Data

Mar. 14, 2018 (JP) .............................. JP2018-047132

(51) Int. Cl.
*H01L 21/00* (2006.01)
*H01L 27/11582* (2017.01)
(Continued)

(52) U.S. Cl.
CPC .... *H01L 27/11582* (2013.01); *H01L 21/0262* (2013.01); *H01L 21/02532* (2013.01);
(Continued)

(58) Field of Classification Search
CPC ......... H01L 27/11582; H01L 29/40114; H01L 29/40117; H01L 21/0262; H01L 21/324; H01L 27/11519; H01L 27/11556; H01L 27/11565; H01L 29/103; H01L 29/105; H01L 29/167; H01L 29/7883; H01L 29/7889
See application file for complete search history.

(56) References Cited

U.S. PATENT DOCUMENTS 9,437,601 B1 * 9/2016 Sonehara .......... H01L 27/11521
2010/0244119 A1 9/2010 Fukuzumi et al.
(Continued)

OTHER PUBLICATIONS

Frank Wirbeleit, "Non-Gaussian Diffusion Model for Phosphorus in Silicon Heavy-Doped Junctions," Diffusion-Fundamentals 9 (2009) 5.1-5.7, 7 pages.
(Continued)

*Primary Examiner* — Mounir S Amer
*Assistant Examiner* — Alexander Belousov
(74) *Attorney, Agent, or Firm* — Kim & Stewart LLP

(57) ABSTRACT

According to one embodiment, a semiconductor device includes a substrate, a stack comprising a plurality of conductive layers stacked one over the other in a first direction, and an insulating layer interposed between adjacent conductive layers located over the substrate, a first semiconductor layer extending inwardly of the stack and through the plurality of conductive layers in the first direction, a memory layer located between the first semiconductor layer and the plurality of conductive layers, and a second semiconductor layer located over, and in contact with, the first semiconductor layer, wherein the second semiconductor layer includes a third semiconductor layer containing phosphorous, and a fourth semiconductor layer containing carbon provided between the first semiconductor layer and the third semiconductor layer.

11 Claims, 22 Drawing Sheets

(51) Int. Cl.

| | | |
|---|---|---|
| *H01L 29/10* | (2006.01) | |
| *H01L 29/167* | (2006.01) | |
| *H01L 21/311* | (2006.01) | |
| *H01L 21/02* | (2006.01) | |
| *H01L 21/265* | (2006.01) | |
| *H01L 21/324* | (2006.01) | |
| *H01L 27/11519* | (2017.01) | |
| *H01L 29/792* | (2006.01) | |
| *H01L 29/788* | (2006.01) | |
| *H01L 27/11565* | (2017.01) | |
| *H01L 27/11556* | (2017.01) | |
| *H01L 21/28* | (2006.01) | |
| *H01L 21/3105* | (2006.01) | |

(52) U.S. Cl.
CPC .. *H01L 21/26513* (2013.01); *H01L 21/31116* (2013.01); *H01L 21/324* (2013.01); *H01L 27/11519* (2013.01); *H01L 27/11556* (2013.01); *H01L 27/11565* (2013.01); *H01L 29/105* (2013.01); *H01L 29/1037* (2013.01); *H01L 29/167* (2013.01); *H01L 29/40114* (2019.08); *H01L 29/40117* (2019.08); *H01L 29/7883* (2013.01); *H01L 29/7889* (2013.01); *H01L 29/7926* (2013.01); *H01L 21/02592* (2013.01); *H01L 21/02595* (2013.01); *H01L 21/02667* (2013.01); *H01L 21/31053* (2013.01)

(56) References Cited

U.S. PATENT DOCUMENTS

2016/0379981 A1* 12/2016 Balakrishnan ...... H01L 27/0924
257/192
2017/0062451 A1* 3/2017 Shingu ............. H01L 27/11582

OTHER PUBLICATIONS

Ku et al., "Effects of germanium and carbon coimplants on phosphorus diffusion in silicon," Applied Physics Letters 89, 112104, American Institute of Physics, 2006, 4 pages.

* cited by examiner

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2018-047132, filed, Mar. 14, 2018, the entire contents of which are incorporated herein by reference.

FIELD

Embodiments described herein relate generally to a semiconductor device and a manufacturing method thereof.

BACKGROUND

NAND-type flash memories are known in which memory cells are arranged three-dimensionally.

DETAILED DESCRIPTION

Figure 1:
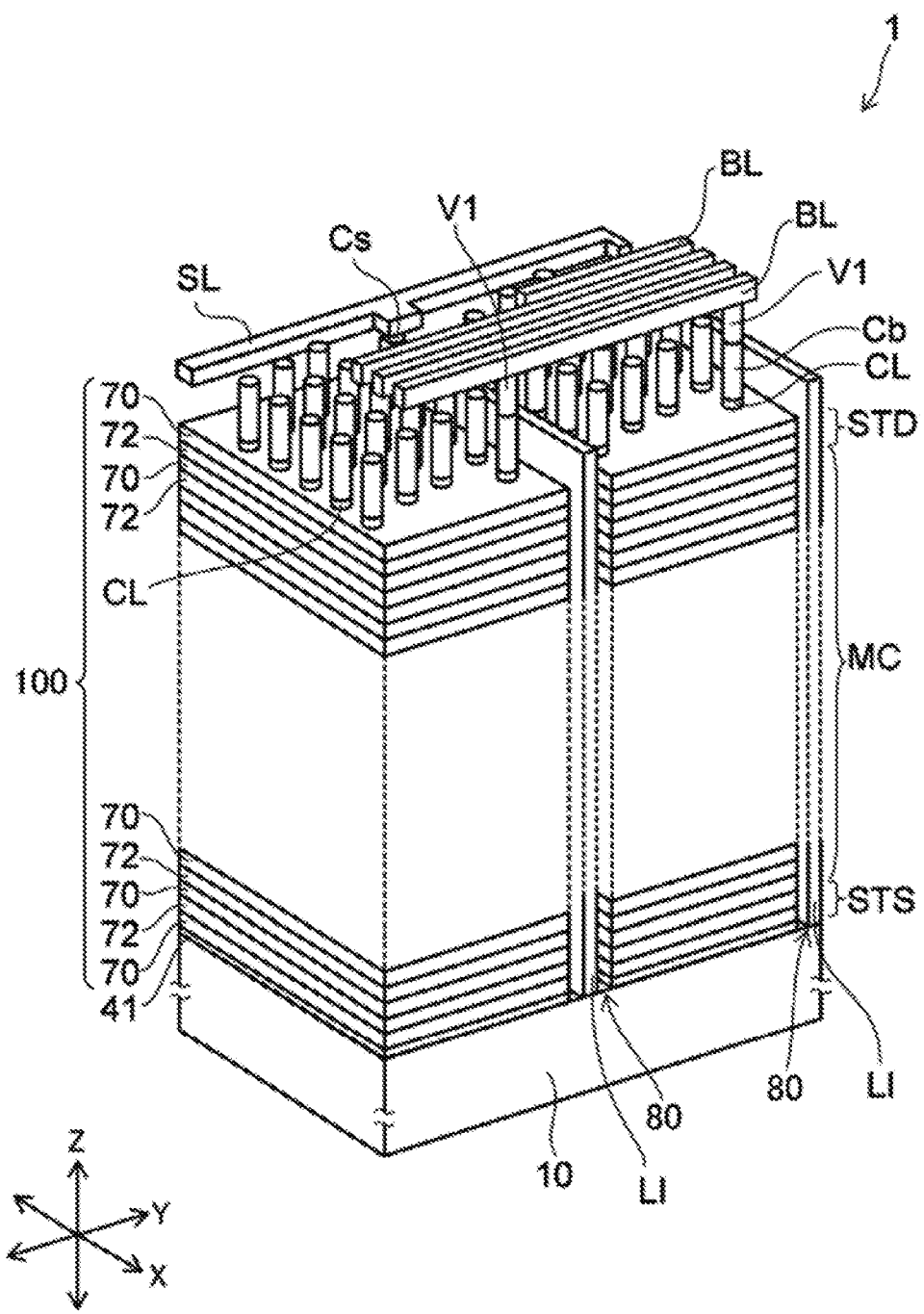
FIG. 1 is a perspective view illustrating a memory cell array in a semiconductor device according to an embodiment.

Embodiments provide a semiconductor device and a manufacturing method thereof, which prevents deterioration of an electric characteristic.

In general, according to one embodiment, a semiconductor device includes a substrate, a stack comprising a plurality of conductive layers stacked one over the other in a first direction, and an insulating layer interposed between adjacent conductive layers located over the substrate, a first semiconductor layer extending inwardly of the stack and through the plurality of conductive layers in the first direction, a memory layer located between the first semiconductor layer and the plurality of conductive layers, and a second semiconductor layer located over, and in contact with, the first semiconductor layer, wherein the second semiconductor layer includes a third semiconductor layer containing phosphorous, and a fourth semiconductor layer containing carbon provided between the first semiconductor layer and the third semiconductor layer.

Hereinafter, the embodiment will be described with reference to drawings. In the drawings, the same portions are denoted by the same reference numerals.

Embodiment

Hereinafter, a semiconductor device according to an embodiment will be described with reference to FIGS. 1 to 22. Here, as the semiconductor device, a three-dimensional stacked NAND-type flash memory is described as an example.

Structure of Embodiment

FIG. 1 is a perspective view illustrating a memory cell array 1 in the semiconductor device according to the embodiment.

In the following description, two directions, which are parallel to a main surface of a substrate 10 and perpendicular to each other, are defined as an X direction and a Y direction. A direction perpendicular to the X direction and the Y direction is defined as a Z direction (a stacking direction). In the Z direction, a direction from the substrate 10 toward a stack 100 is also referred to as "upward," and a direction from the stack 100 toward the substrate 10 is also referred to as "downward," but this notation is intended for convenience, and is irrelevant to a direction of gravity.

As illustrated in FIG. 1, the memory cell array 1 includes the substrate 10, the stack 100 provided at the top side of the substrate 10, a plurality of columnar portions CL, a plurality of separation portions 80, and an upper layer wiring provided at the top side of the stack 100. In FIG. 1, as the upper layer wiring, for example, a bit line BL and a source line SL are illustrated.

The columnar portion CL is formed in substantially a columnar shape extending in the stacking direction (the Z direction) within the stack 100. The plurality of columnar portions CL are arranged in, for example, in a zigzag pattern of columnar portions CL intersecting a plane spreading in the X direction and the Y direction. Otherwise, the plurality of columnar portions CL may be arranged at interstices of a square lattice on a plane spreading in the X direction and the Y direction.

The separation portions 80 separate the stack 100 into a plurality of blocks (or finger portions) spaced in the Y direction. The separation portion 80 includes a wiring portion LI spreading in the X direction and the Z direction. Although not illustrated, an insulating layer is provided between the wiring portion LI and the stack 100.

The wiring portion LI is connected to the source line SL via a contact Cs.

The plurality of bit lines BL and the source line SL are provided over the upper side of the stack 100. The plurality of bit lines BL and the source line SL are, for example, metal layers, and they each extend in the Y direction. The plurality of bit lines BL are spaced from each other in the X direction.

The upper end portion of a semiconductor layer 60 (to be described below) in the columnar portion CL is connected to the bit line BL via a contact Cb and a contact V1. The contact Cb and the contact V1 are, for example, metal layers containing tungsten.

A plurality of the columnar portions CL are connected to one common bit line BL. The plurality of columnar portions CL connected to the common bit line BL include the columnar portions CL which are selected one by one from individual blocks separated by the separation portions 80 in the Y direction.

A drain side select transistor STD is provided at the upper layer portion of the stack 100. A source side select transistor STS is provided at the lower layer portion of the stack 100.

Among a plurality of conductive layers 70 of the stack 100, at least the uppermost conductive layer 70 functions as a control gate of the drain side select transistor STD. Among the plurality of the conductive layers 70 of the stack 100, at least the lowermost conductive layer 70 functions as a control gate of the source side select transistor STS. A second portion 10b of the substrate 10, which is to be described below, becomes a channel of the source side select transistor STS.

A plurality of memory cells MC are provided between the drain side select transistor STD and the source side select transistor STS. The plurality of memory cells MC, the drain side select transistor STD, and the source side select transistor STS are connected in series through a semiconductor layer 20 of the columnar portion CL to constitute one memory string. The memory strings are arranged in, for example, zigzags in a plane direction parallel to the XY plane such that the plurality of memory cells MC are three-dimensionally provided in the X direction, the Y direction and the Z direction.

Figure 2:
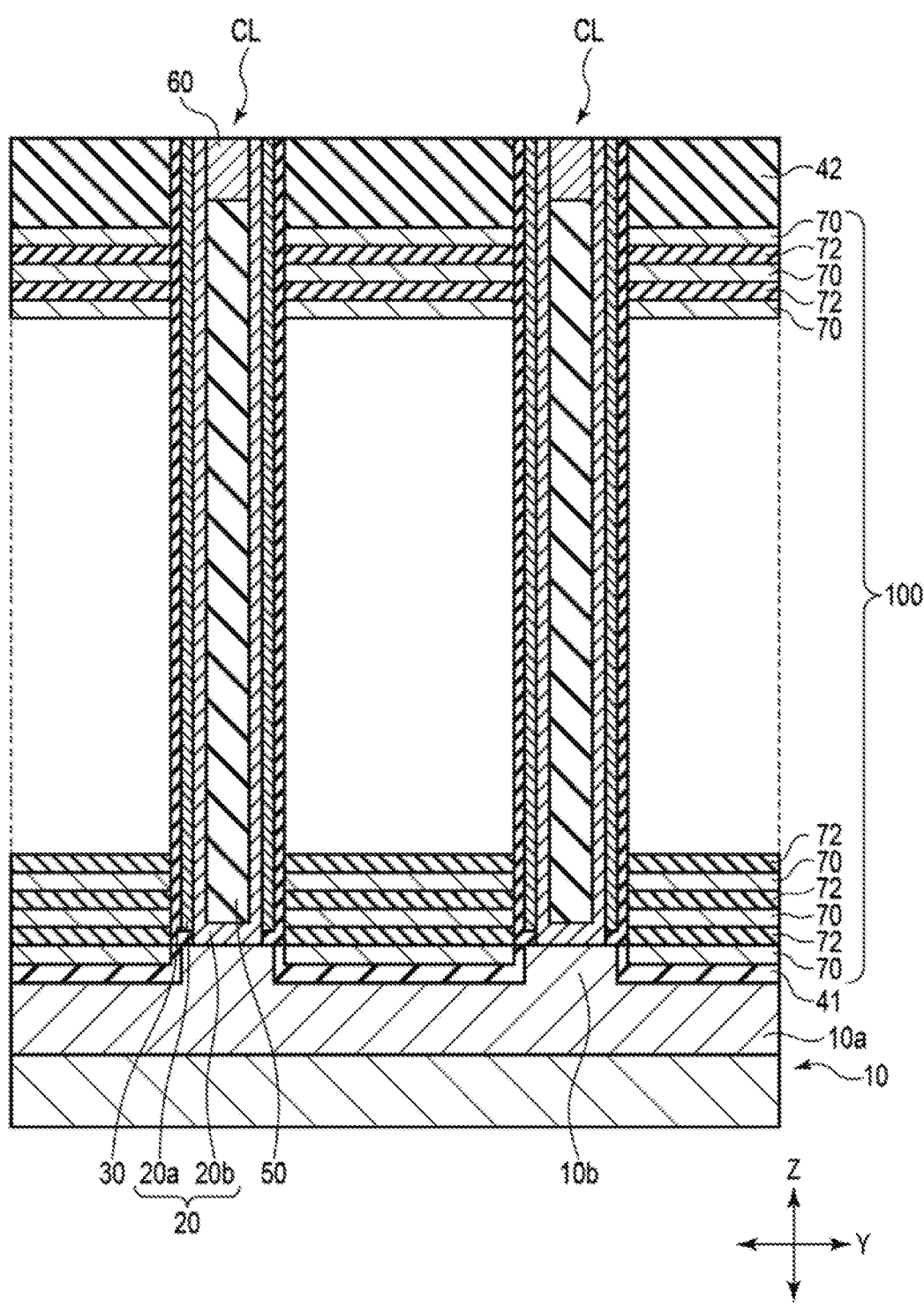
FIG. 2 is a sectional view illustrating the memory cell array in the semiconductor device according to the embodiment.

FIG. 2 is a sectional view illustrating the memory cell array 1 in the semiconductor device according to the embodiment.

As illustrated in FIG. 2, the substrate 10 includes a first portion 10a and the second portion 10b. The substrate 10 is a semiconductor substrate, and is, for example, a silicon substrate mainly containing silicon.

The first portion 10a is a P-type silicon region (P-type well) provided at the surface side of the substrate 10. The second portion 10b protrudes upwards from the top surface of the first portion 10a. The second portion 10b is provided under the columnar portion CL, and is provided in a columnar shape to correspond to the columnar portion CL.

As described below, the second portion 10b is a crystal layer epitaxially grown from the first portion 10a. The first portion 10a and the second portion 10b form an integrated single crystal region, and have substantially the same crystal orientation. Like the first portion 10a, the second portion 10b is a P-type silicon region. Each of the first portion 10a and the second portion 10b includes, for example, boron as P-type impurities therein.

An insulating layer 41 is provided on the first portion 10a and around the second portion 10b.

The stack 100 is provided on the substrate 10 over the insulating layer 41. The stack 100 includes the plurality of conductive layers 70 and a plurality of insulating layers 72. The plurality of the conductive layers 70 are stacked one over the other with the insulating layers (insulators) 72 interposed therebetween, in a direction (the Z direction) perpendicular to the main surface of the substrate 10. That is, the plurality of conductive layers 70 and the plurality of insulating layers 72 are alternately stacked over the substrate 10.

The conductive layer 70 is, for example, a metal layer. The conductive layer 70 is, for example, a tungsten layer containing tungsten as a main component, or a molybdenum layer containing molybdenum as a main component. The insulating layer 72 is, for example, a silicon oxide layer containing silicon oxide as a main component.

The columnar portion CL extends within the stack 100 and an insulating layer 42 formed thereover, in the stacking direction (the Z direction). The columnar portion CL includes a core layer 50, the semiconductor layer 20, and a memory layer 30 which are provided in order from the center. The columnar portion CL includes the semiconductor layer 60, as a cap layer, provided on the core layer 50.

The core layer 50 is provided as a central portion in the columnar portion CL. The core layer 50 is, for example, a silicon oxide layer containing silicon oxide as a main component.

The semiconductor layer 20 extends around the core layer 50 in the columnar portion CL. That is, the semiconductor layer 20 is provided between the core layer 50 and the memory layer 30. The semiconductor layer 20 includes a body layer 20b provided around the core layer 50, and a cover layer 20a provided around the body layer 20b. The lower end of the body layer 20b is in contact with the second portion 10b of the substrate 10. The semiconductor layer 20 is, for example, a polysilicon layer containing boron (doped with boron impurities), or an amorphous silicon layer containing boron.

The memory layer 30 extends around the semiconductor layer 20 in the columnar portion CL. That is, the memory layer 30 is provided between the semiconductor layer 20 and the stack 100.

Figure 3:
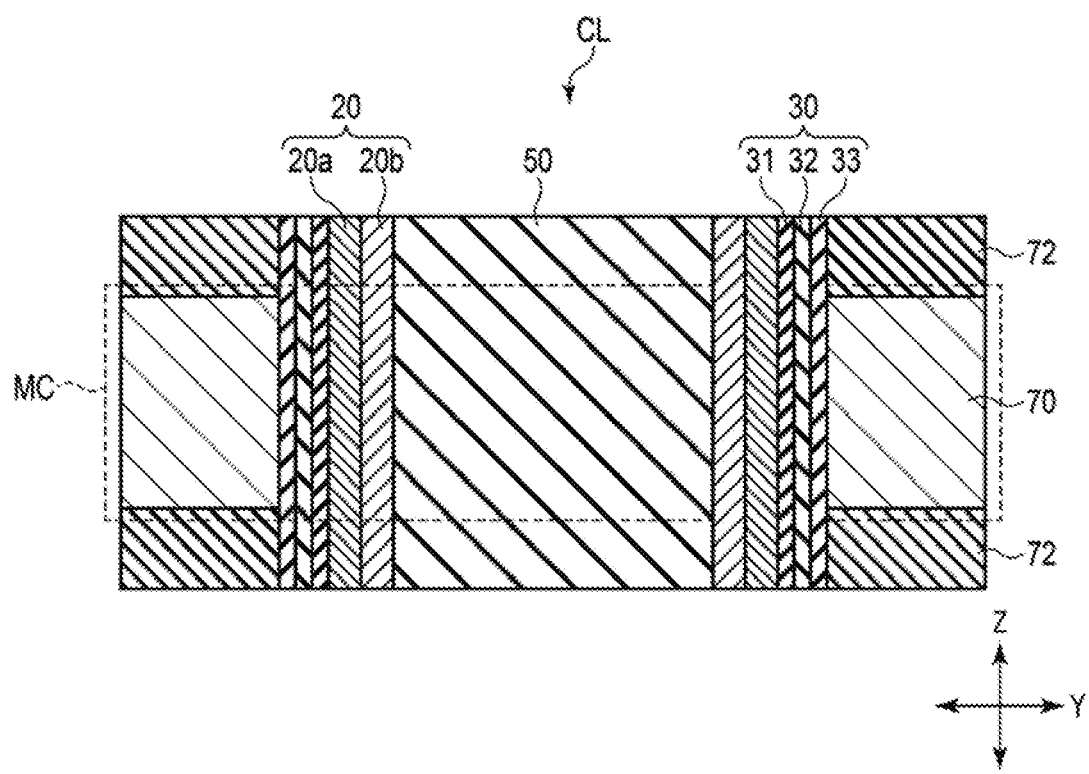
FIG. 3 is a sectional view illustrating a part of a stack and a columnar portion in the semiconductor device according to the embodiment, in an enlarged scale.

FIG. 3 is a sectional view illustrating a part of the stack 100 and the columnar portion CL in the semiconductor device according to the embodiment, in an enlarged scale. FIG. 3 mainly illustrates a portion of a memory cell MC in the columnar portion CL.

As illustrated in FIG. 3, the memory layer 30 includes a tunnel insulating layer 31, a charge storage layer 32, and a block insulating layer 33.

The tunnel insulating layer 31 is provided between the semiconductor layer 20 and the charge storage layer 32. The charge storage layer 32 is provided between the tunnel insulating layer 31 and the block insulating layer 33. The block insulating layer 33 is provided between the charge storage layer 32 and the conductive layer 70 (and the insulating layer 72).

The semiconductor layer 20, the memory layer 30, and the conductive layer 70 of the stack constitute a memory cell MC. The memory cell MC has a vertical transistor structure in which the semiconductor layer 20 is surrounded by the conductive layer 70 with the memory layer 30 therebetween. A plurality of memory cells MC are provided in the stack 100.

In the memory cell MC having a vertical transistor structure, the semiconductor layer 20 functions as a channel, and the conductive layer 70 functions as a control gate (a word line). The charge storage layer 32 functions as a data storage layer in which charges injected from the semiconductor layer 20 are accumulated.

The memory cell MC is, for example, a charge trap-type memory cell. The charge storage layer 32 includes a large number of trap sites which trap charges in an insulating layer. The charge storage layer 32 is, for example, a silicon nitride layer containing silicon nitride as a main component. Alternatively, the charge storage layer 32 may be a floating gate having conductivity, which is surrounded by an insulator.

The tunnel insulating layer 31 becomes a potential barrier when charges are injected from the semiconductor layer 20 to the charge storage layer 32, or when charges accumulated in the charge storage layer 32 are released to the semiconductor layer 20. The tunnel insulating layer 31 is, for example, a silicon oxide layer containing silicon oxide as a main component.

The block insulating layer 33 prevents charges accumulated in the charge storage layer 32 from being released to the conductive layer 70. The block insulating layer 33 prevents back tunneling of charges from the conductive layer 70 to the columnar portion CL.

The block insulating layer 33 is, for example, a silicon oxide layer containing silicon oxide as a main component. The block insulating layer 33 may have a structure in which a silicon oxide layer and a metal oxide layer are stacked. In this case, the silicon oxide layer is provided between the charge storage layer 32 and the metal oxide layer, and the metal oxide layer is provided between the silicon oxide layer and the conductive layer 70. As the metal oxide layer, for example, an aluminum oxide layer containing aluminum oxide as a main component, a zirconium oxide layer containing zirconium oxide as a main component, or a hafnium oxide layer containing hafnium oxide as a main component may be exemplified.

Figure 4:
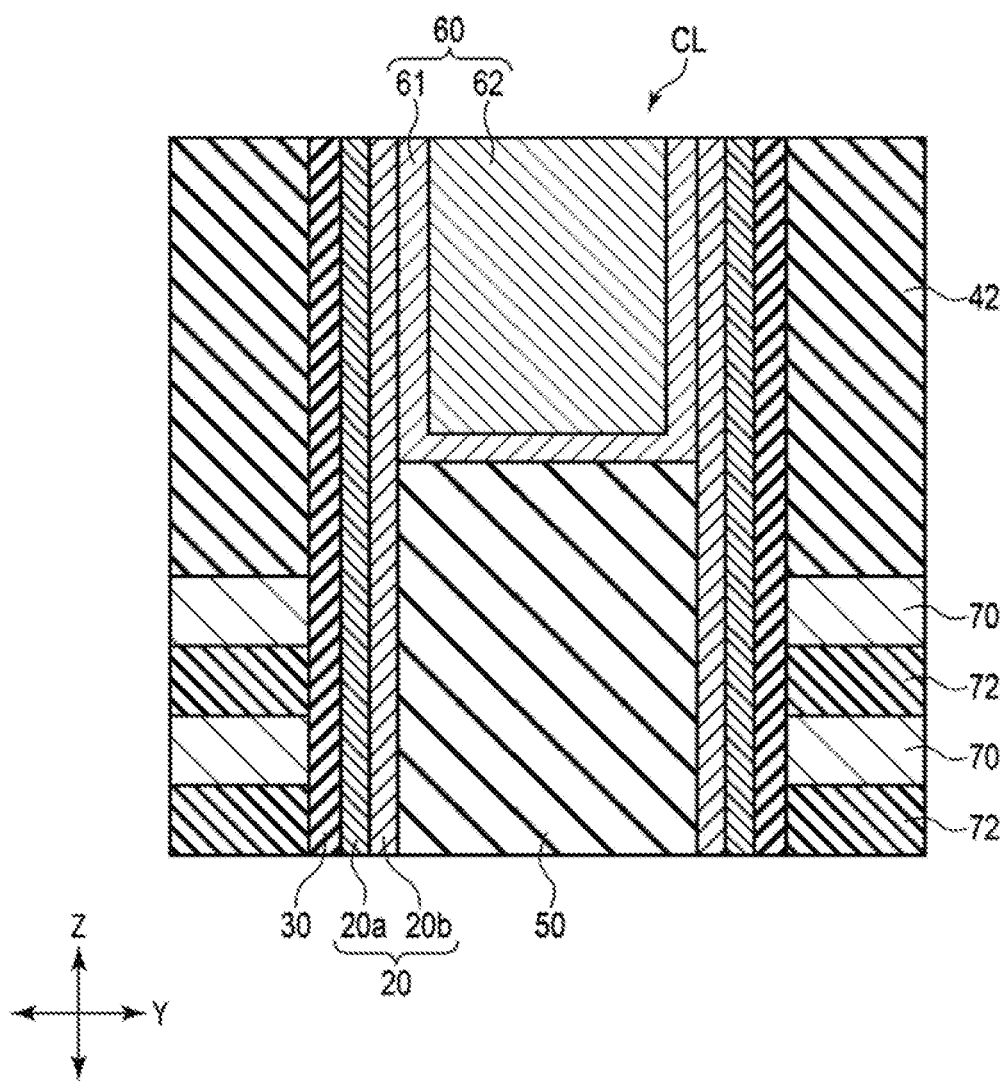
FIG. 4 is a sectional view illustrating a part of the stack and the columnar portion in the semiconductor device according to the embodiment, in an enlarged scale.

FIG. 4 is a sectional view illustrating a part of the stack 100 and the columnar portion CL in the semiconductor device according to the embodiment, in an enlarged scale. FIG. 4 mainly illustrates an upper end portion of the columnar portion CL, that is, a portion including the semiconductor layer 60. Here, the upper end portion of the columnar portion CL indicates a portion corresponding to the location of the insulating layer 42 of the columnar portion CL.

As illustrated in FIG. 4, the semiconductor layer 60 is provided on the core layer 50 in the upper end portion of the columnar portion CL. The lower end (lower surface) of the semiconductor layer 60 is located at a position higher than the upper end (upper surface) of the uppermost conductive layer 70. The semiconductor layer 60 is provided in a region of the memory hole from which a portion of the upper end portion of the core layer has been removed. Thus, like the core layer 50, the semiconductor layer 60 is provided as a central portion of the columnar portion CL, and the periphery of the semiconductor layer 60 is covered with the semiconductor layer 20. Accordingly, the semiconductor layer 60 is in contact with the upper end portion of the semiconductor layer 20. The contact Cb illustrated in FIG. 1 is connected to the upper end of the semiconductor layer 60. The semiconductor layer 60 becomes a cap layer and achieves electrical matching between the semiconductor layer 20 and the contact Cb.

The semiconductor layer 60 includes a first semiconductor layer 61 and a second semiconductor layer 62. The second semiconductor layer 62 is provided as a central portion of the columnar portion CL. The first semiconductor layer 61 covers the periphery (the side surface and the bottom surface) of the second semiconductor layer 62. That is, the first semiconductor layer 61 is provided between the second semiconductor layer 62 and the semiconductor layer 20, and between the second semiconductor layer 62 and the core layer 50. Accordingly, the second semiconductor layer 62 is not in contact with the semiconductor layer 20.

The first semiconductor layer 61 is, for example, a polysilicon layer containing carbon (doped with carbon), or an amorphous silicon layer containing carbon. The second semiconductor layer 62 is a polysilicon layer containing phosphorous (doped with phosphorous), or an amorphous silicon layer containing phosphorous.

Figure 5:
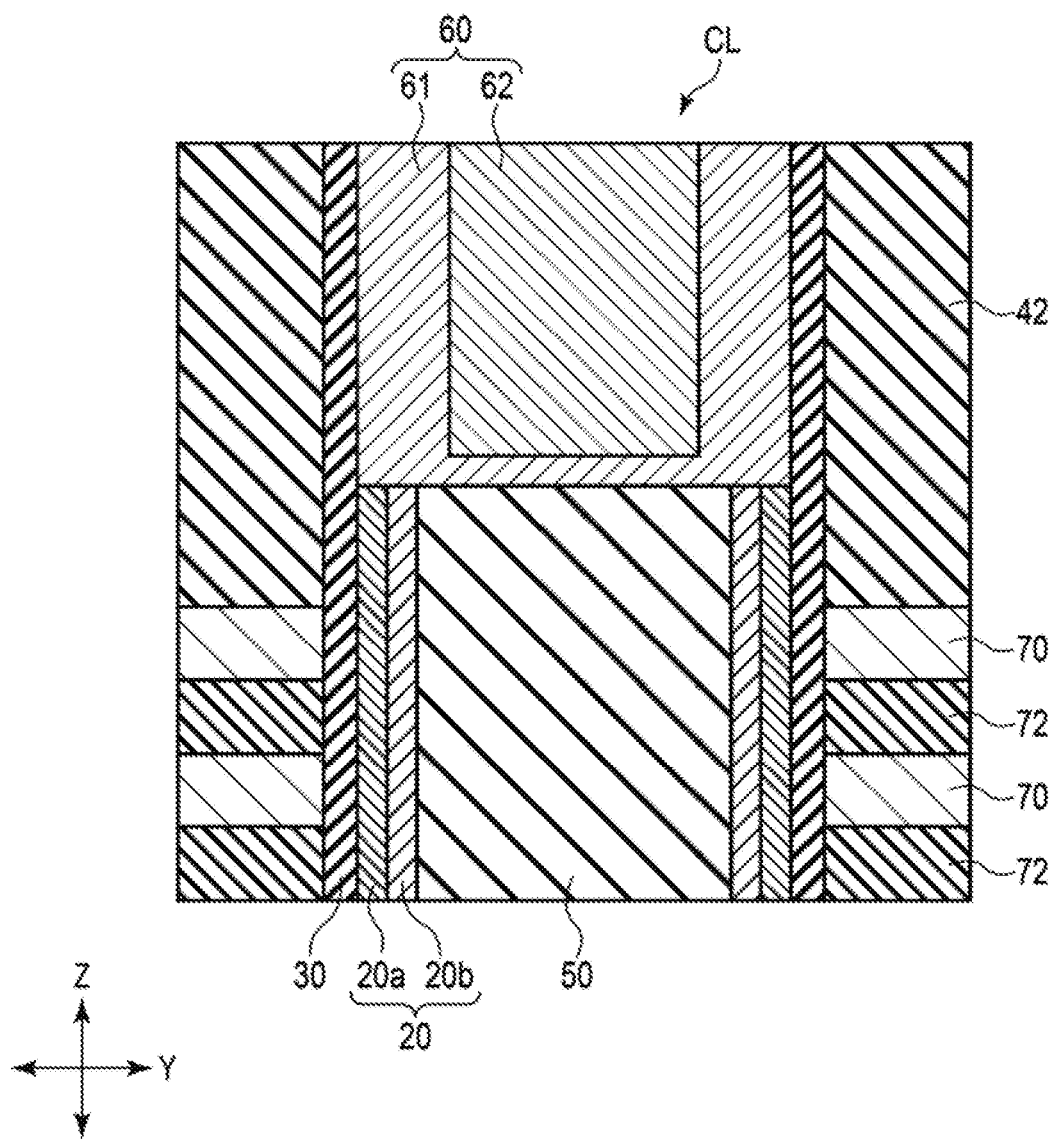
FIG. 5 is a sectional view illustrating a part of the stack and the columnar portion in the semiconductor device according to the embodiment, in an enlarged scale.

FIG. 5 is a sectional view illustrating a part of the stack 100 and the columnar portion CL in the semiconductor device according to the embodiment, in an enlarged scale, and corresponds to a modification of the semiconductor layer 60 illustrated in FIG. 4.

As illustrated in FIG. 5, in the modification, the semiconductor layer 60 is provided on the core layer 50 and the semiconductor layer 20 in the upper end portion of the columnar portion CL. The lower end (lower surface) of the semiconductor layer 60 is located at a position higher than the upper end (upper surface) of the uppermost conductive layer 70. The semiconductor layer 60 is provided in a region of the memory hole from which a portion of the upper end of the core layer 50 has been removed. The first semiconductor layer 61 is integrated with the upper end portion of the semiconductor layer 20. This is because when the first semiconductor layer and the semiconductor layer 20 are annealed in a manufacturing process, they are similarly converted to polysilicon (poly crystalline silicon) and form a single continuous structure. Here, the integrated semiconductor layer 20 (the first semiconductor layer 61) contains carbon. The periphery of the first semiconductor layer 61 is covered with the memory layer 30.

Figure 6:
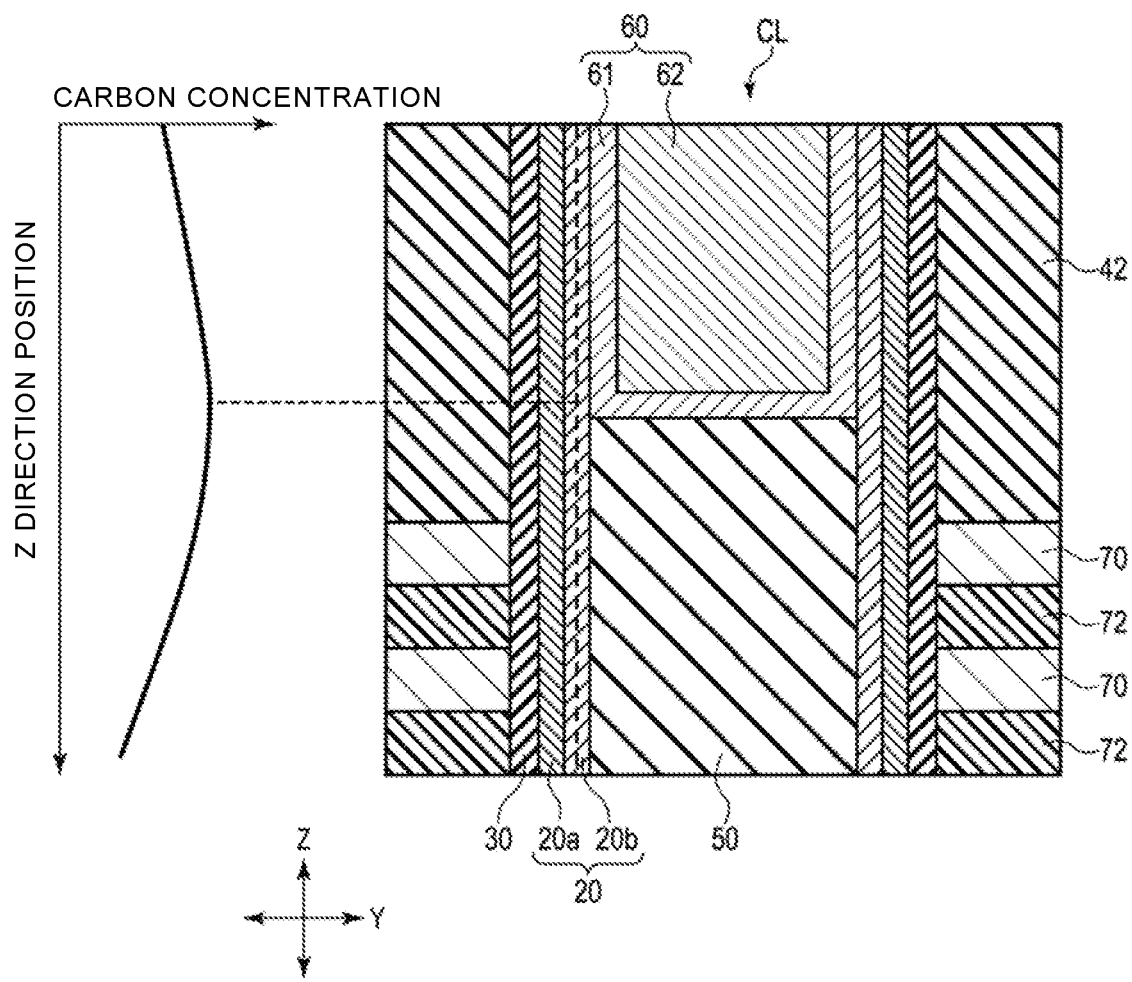
FIG. 6 is a view illustrating a carbon concentration of the columnar portion in the semiconductor device according to the embodiment.

FIG. 6 is a view illustrating a carbon concentration of the columnar portion CL in the semiconductor device according to the embodiment. FIG. 6 illustrates a carbon concentration distribution around the upper end portion of the semiconductor layer 20 in the Z direction.

As illustrated in FIG. 6, the semiconductor layer 20 contains carbon diffused thereinto from the first semiconductor layer 61. The carbon concentration in the semiconductor layer 20 is lower than the carbon concentration of the first semiconductor layer 61. The semiconductor layer 20 has the highest carbon concentration at a Z direction position (referred to as a first position) corresponding to the interface of the first semiconductor layer 61 with the bottom surface of the second semiconductor layer 62. Then, the carbon concentration in the semiconductor layer 20 monotonously decreases from the first position in the direction of the lower side or end thereof. The carbon concentration in the semiconductor layer 20 also monotonously decreases from the first position toward the upper side or end thereof. That is, the carbon concentration in the semiconductor layer 20 decreases in a direction away from the first position in the Z direction.

This is because carbon is diffused from the first semiconductor layer 61 provided at the bottom surface of the second semiconductor layer 62 to the semiconductor layer 20 by annealing properly performed in a manufacturing process. The carbon concentration in the semiconductor layer 20 becomes higher in the portion of the semiconductor layer distally above the first position than that distally below the first position. This is because, into the semiconductor layer 20 at the upper side of the first position, carbon is diffused not only from the first semiconductor layer 61 provided at the bottom surface of the second semiconductor layer 62 but also from the first semiconductor layer 61 provided at the side surface of the second semiconductor layer 62.

Figure 7:
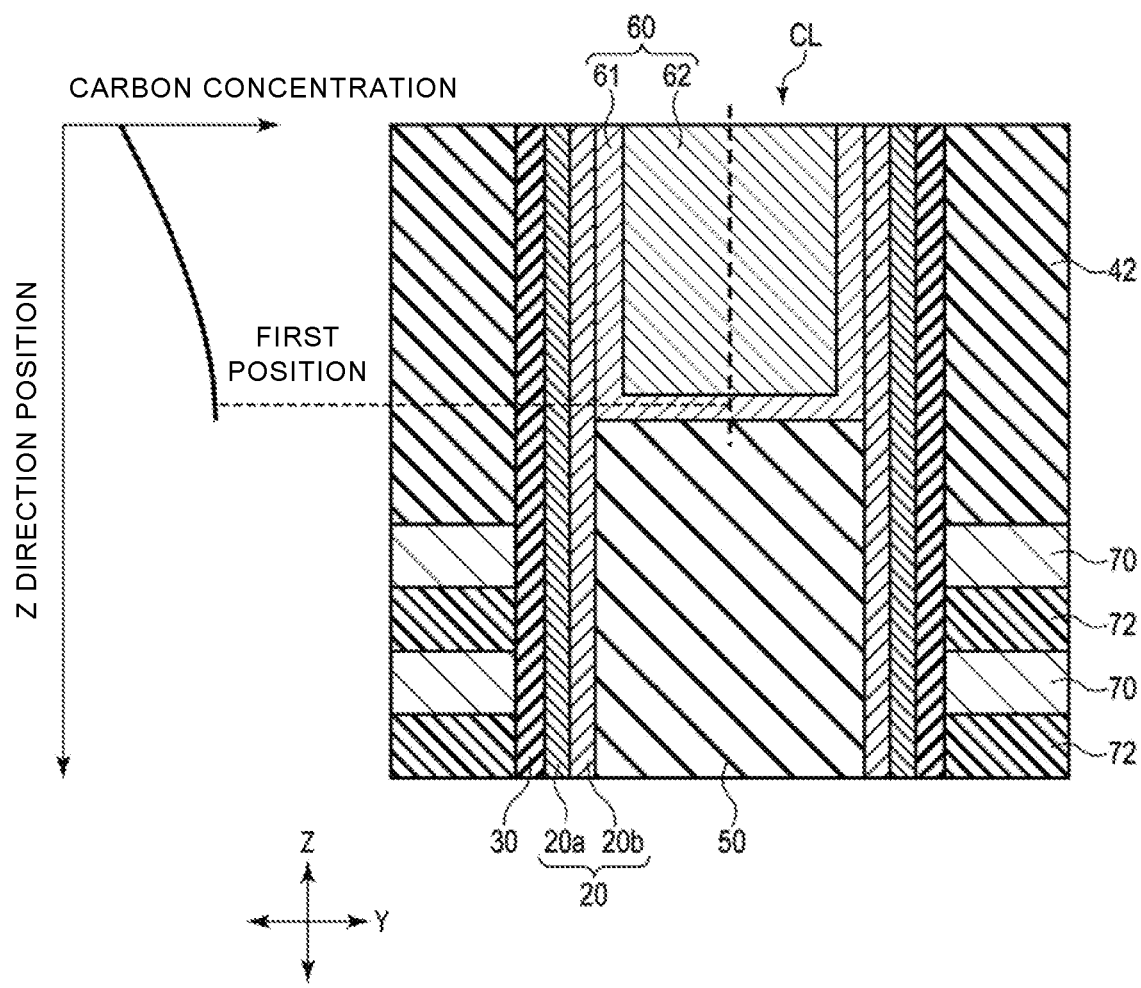
FIG. 7 is a view illustrating a carbon concentration of the columnar portion in the semiconductor device according to the embodiment.

FIG. 7 is a view illustrating a carbon concentration of the columnar portion CL in the semiconductor device according to the embodiment. FIG. 7 illustrates a carbon concentration distribution in the semiconductor layer 60 in the Z direction.

As illustrated in FIG. 7, the highest carbon concentration in the semiconductor layer 60 corresponds to the interface thereof with the first semiconductor layer 61, which corresponds to the location of the first position. From there, the carbon concentration in the semiconductor layer 60 monotonously decreases from the first position (the first semiconductor layer 61) toward the upper side or end (the second semiconductor layer 62 side) thereof. That is, the carbon concentration in the semiconductor layer 60 decreases in a direction away from the first position and away from the semiconductor substrate 10 in the Z direction.

This is because, as in the semiconductor layer 20 illustrated in FIG. 6, carbon is diffused from the first semiconductor layer 61 corresponding to the first position to the second semiconductor layer 62 by annealing properly performed in a manufacturing process.

Figure 8:
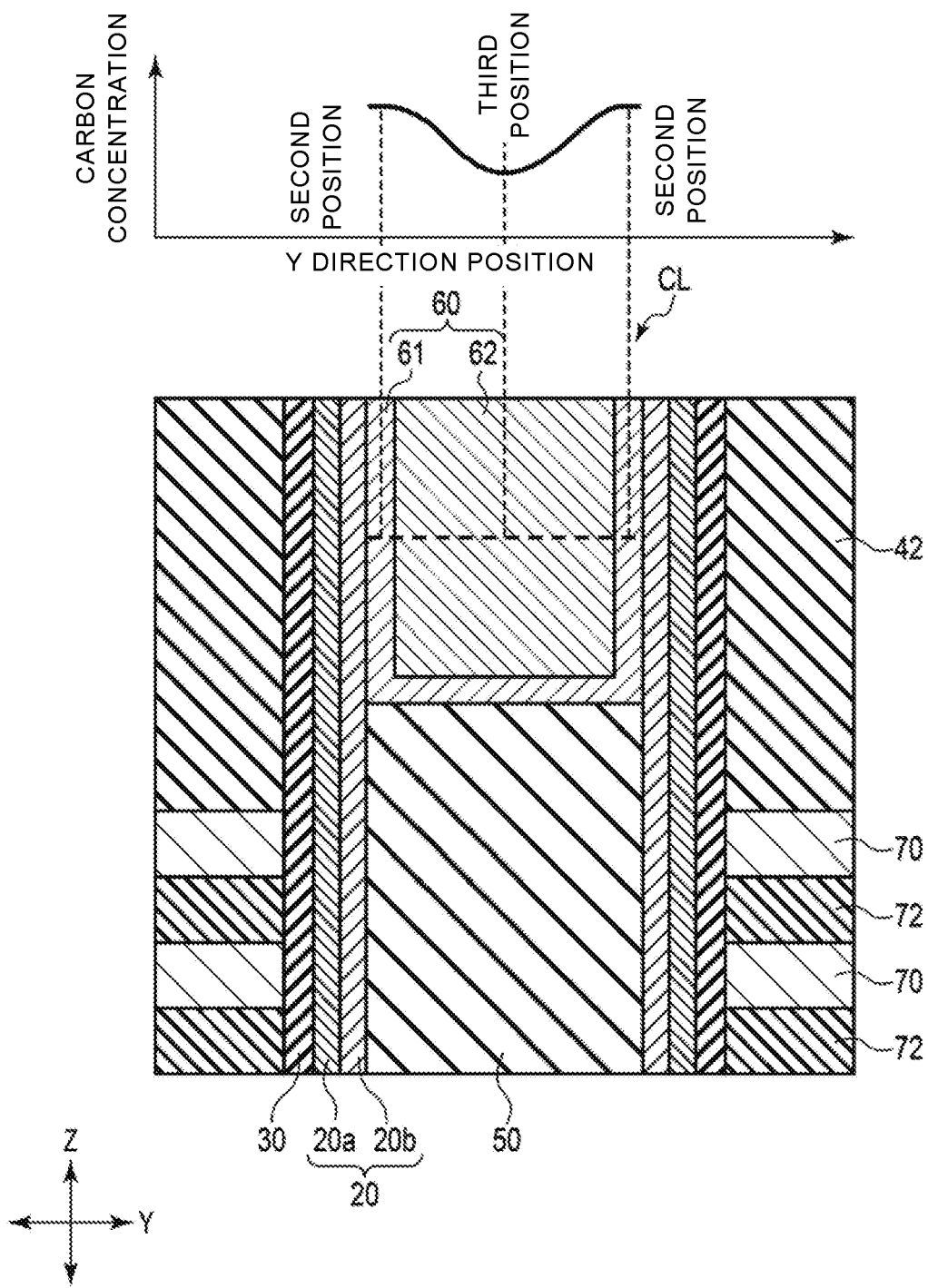
FIG. 8 is a view illustrating a carbon concentration of the columnar portion in the semiconductor device according to the embodiment.

FIG. 8 is a view illustrating the carbon concentration of the columnar portion CL in the semiconductor device according to the embodiment. FIG. 8 illustrates the carbon concentration distribution in the semiconductor layer 60 in the Y direction.

As illustrated in FIG. 8, the semiconductor layer 60 has the highest carbon concentration at a Y direction position (referred to as a second position) corresponding to the interface between the first semiconductor layer 61 and the surrounding second semiconductor layer 62. That is, the semiconductor layer 60 has the highest carbon concentration at the end portions thereof in the Y direction. The carbon concentration in the semiconductor layer 60 monotonously decreases from the second position (the first semiconductor layer 61) toward the central portion of the second semiconductor layer 62 in the Y direction (referred to as a third position). That is, the carbon concentration in the semiconductor layer 60 decreases in a direction away from the second position in the Y direction.

This is because, as in the semiconductor layer 20 illustrated in FIG. 6, carbon is diffused from the first semiconductor layer 61 corresponding to the second position to the second semiconductor layer 62 by annealing properly performed in a manufacturing process.

Manufacturing Method of Embodiment

FIGS. 9 to 21 are sectional views illustrating a manufacturing process of the memory cell array 1 in the semiconductor device according to the embodiment.

Figure 9:
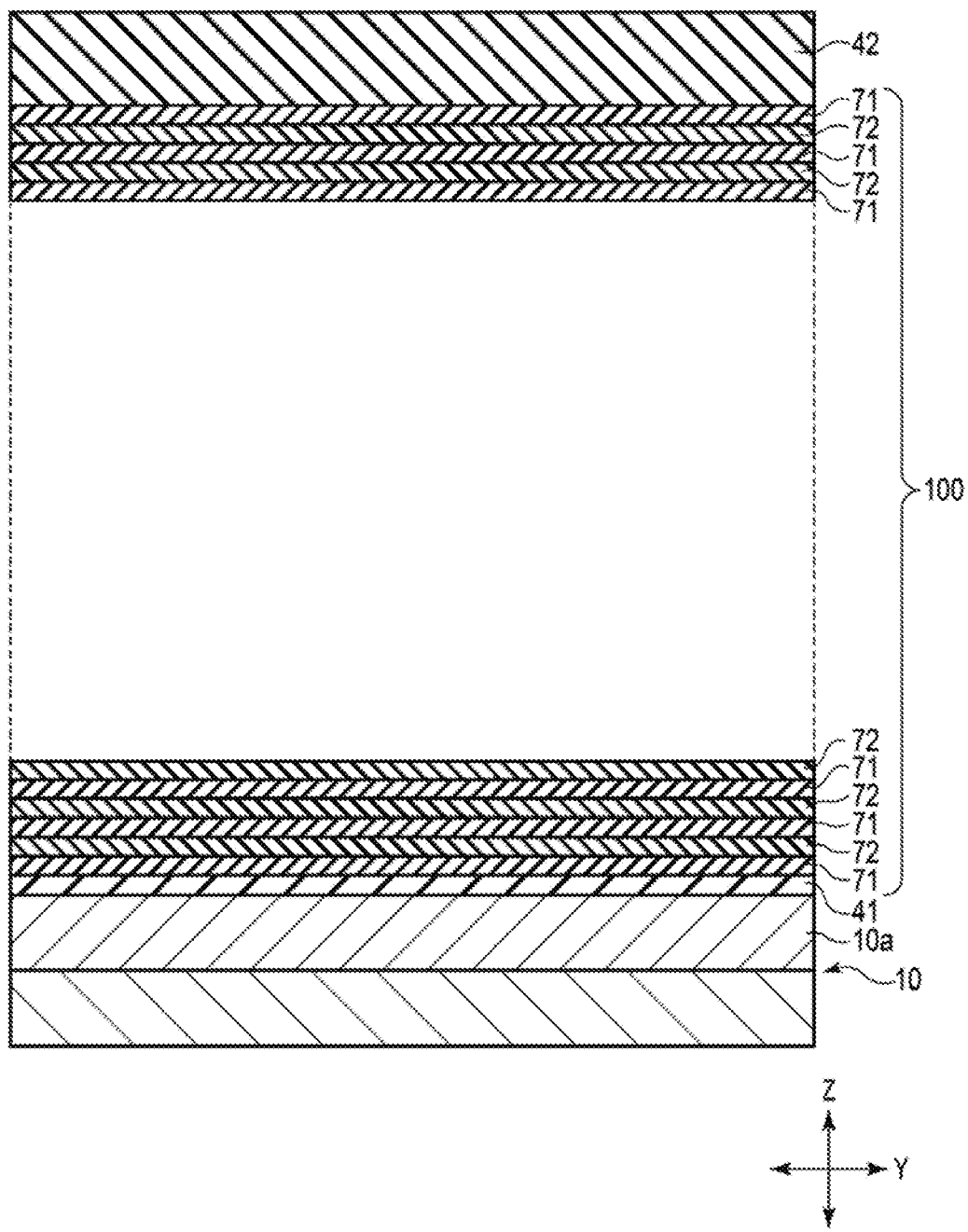
FIG. 9 is a sectional view illustrating a manufacturing process of the memory cell array in the semiconductor device according to the embodiment.

First, as illustrated in FIG. 9, the insulating layer 41 is formed on the first portion 10a of the substrate 10. On the insulating layer 41, sacrificial layers 71 as a first layer and insulating layers 72 as a second layer are alternately stacked one over the other. A process of alternately stacking the sacrificial layer 71 and the insulating layer 72 is repeated to form the stack 100 including the plurality of the sacrificial layers 71 and the plurality of insulating layers 72, on the substrate 10. The insulating layer 42 is formed over the stack 100.

For example, the sacrificial layer 71 is a silicon nitride layer, and the insulating layers 41, 42, and 72 are silicon oxide layers.

Figure 10:
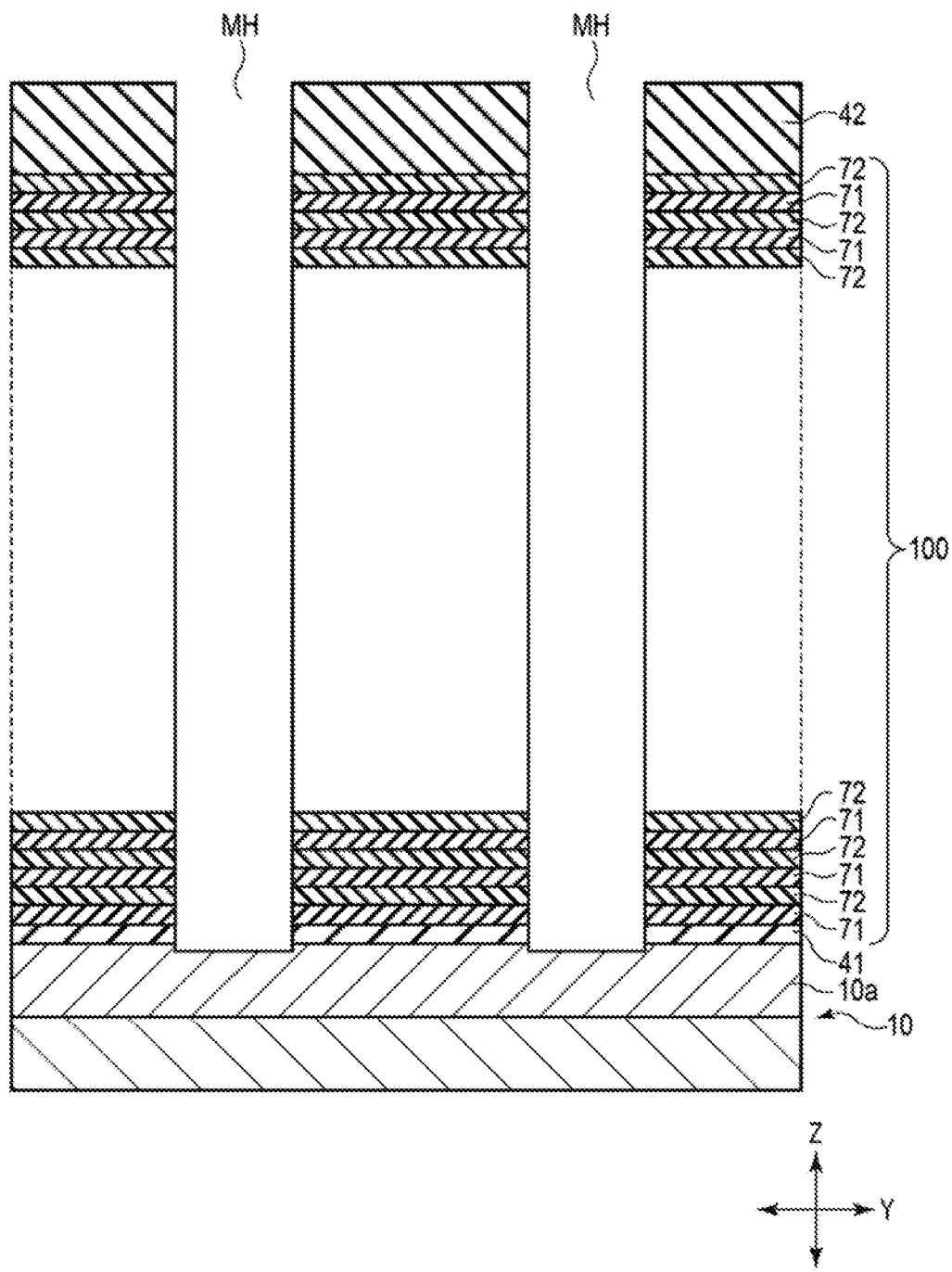
FIG. 10 is a sectional view illustrating a manufacturing process of the memory cell array in the semiconductor device according to the embodiment.

Next, as illustrated in FIG. 10, a plurality of memory holes MH are formed extending through the insulating layers 41 and 42 and the stack 100 in the Z direction. The memory hole MH is formed by, for example, reactive ion etching (RIE) using a mask layer (not illustrated). The memory hole MH extends through the insulating layers 41 and 42 and the stack 100 to reach the substrate 10 (the first portion 10a).

Figure 11:
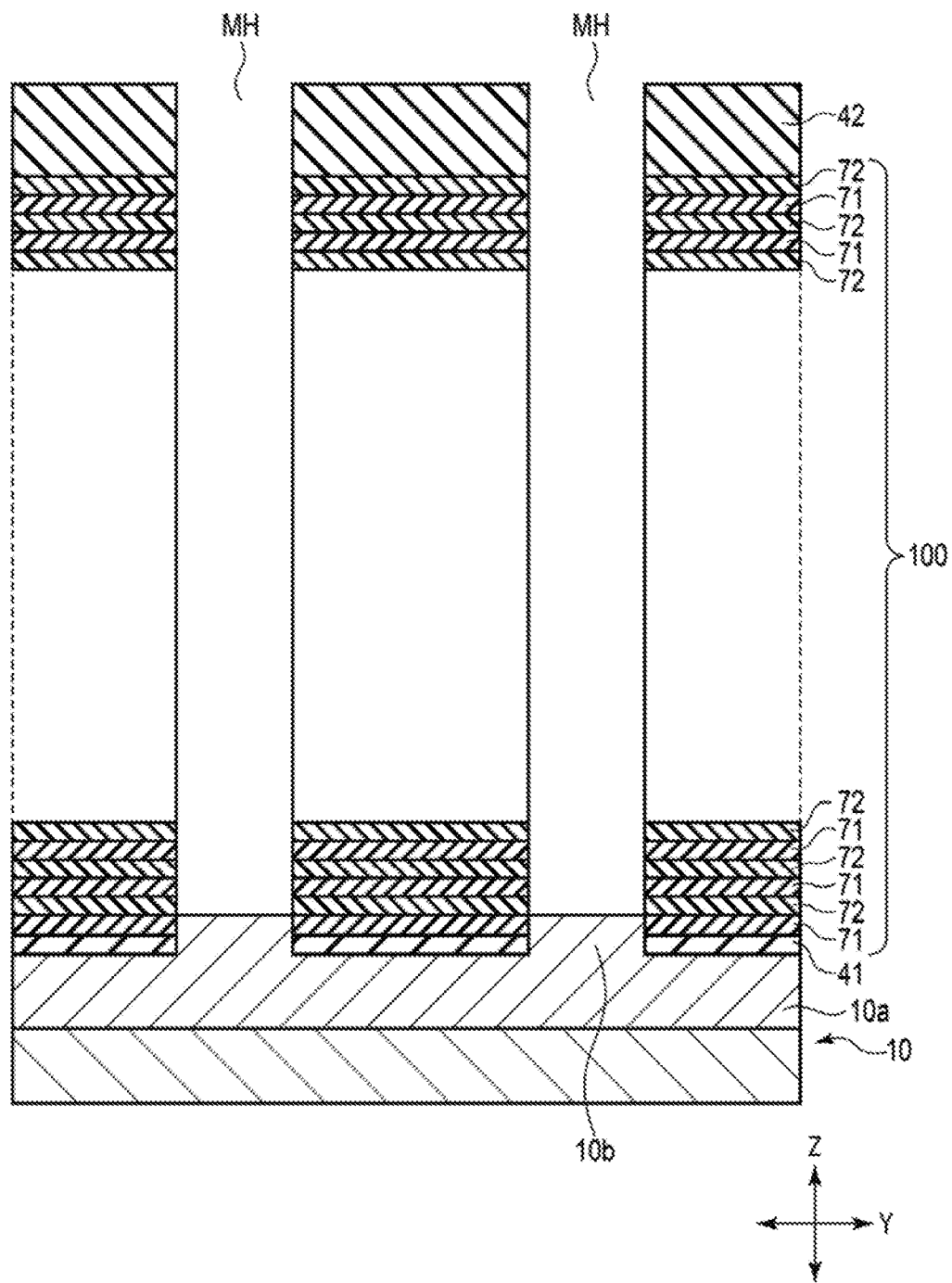
FIG. 11 is a sectional view illustrating a manufacturing process of the memory cell array in the semiconductor device according to the embodiment.

Next, as illustrated in FIG. 11, silicon is epitaxially grown from an exposed portion of the first portion 10a at the bottom of the memory hole MH. Accordingly, the second portion 10b is formed as a silicon crystal layer at the bottom of the memory hole MH. The second portion 10b is grown such that the height of the upper surface of the second portion 10b becomes substantially the same as the upper surface of the lowermost sacrificial layer 71 in the stack 100.

Figure 12:
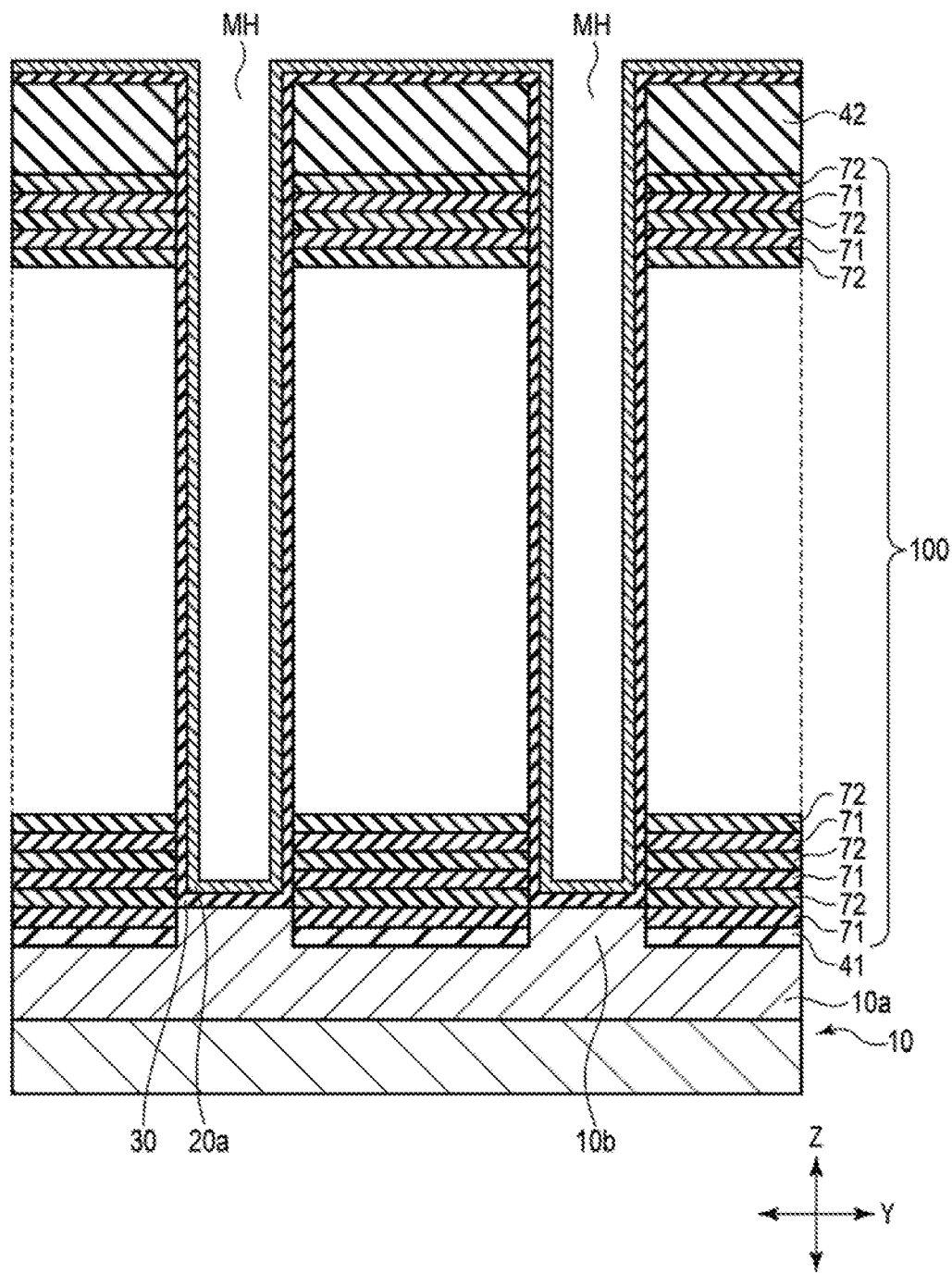
FIG. 12 is a sectional view illustrating a manufacturing process of the memory cell array in the semiconductor device according to the embodiment.

Next, as illustrated in FIG. 12, the memory layer 30 is formed inside the stack 100 and the insulating layer 42 within the memory hole MH. The memory layer 30 is conformally formed along the side surface of the stack 100 and the insulating layer 42 in the memory hole MH and the bottom of the substrate 10 within the memory hole MH. The memory layer 30 is also formed over the insulating layer 42. Here, the block insulating layer 33, the charge storage layer 32, and the tunnel insulating layer 31 illustrated in FIG. 3 are sequentially formed within the memory hole MH.

Then, the cover layer 20a is formed inside the memory layer 30 within the memory hole MH. The cover layer 20a is conformally formed along the side surface and the bottom of the memory layer 30 within the memory hole MH. The cover layer 20a is also formed on the memory layer 30 over the insulating layer 42.

Figure 13:
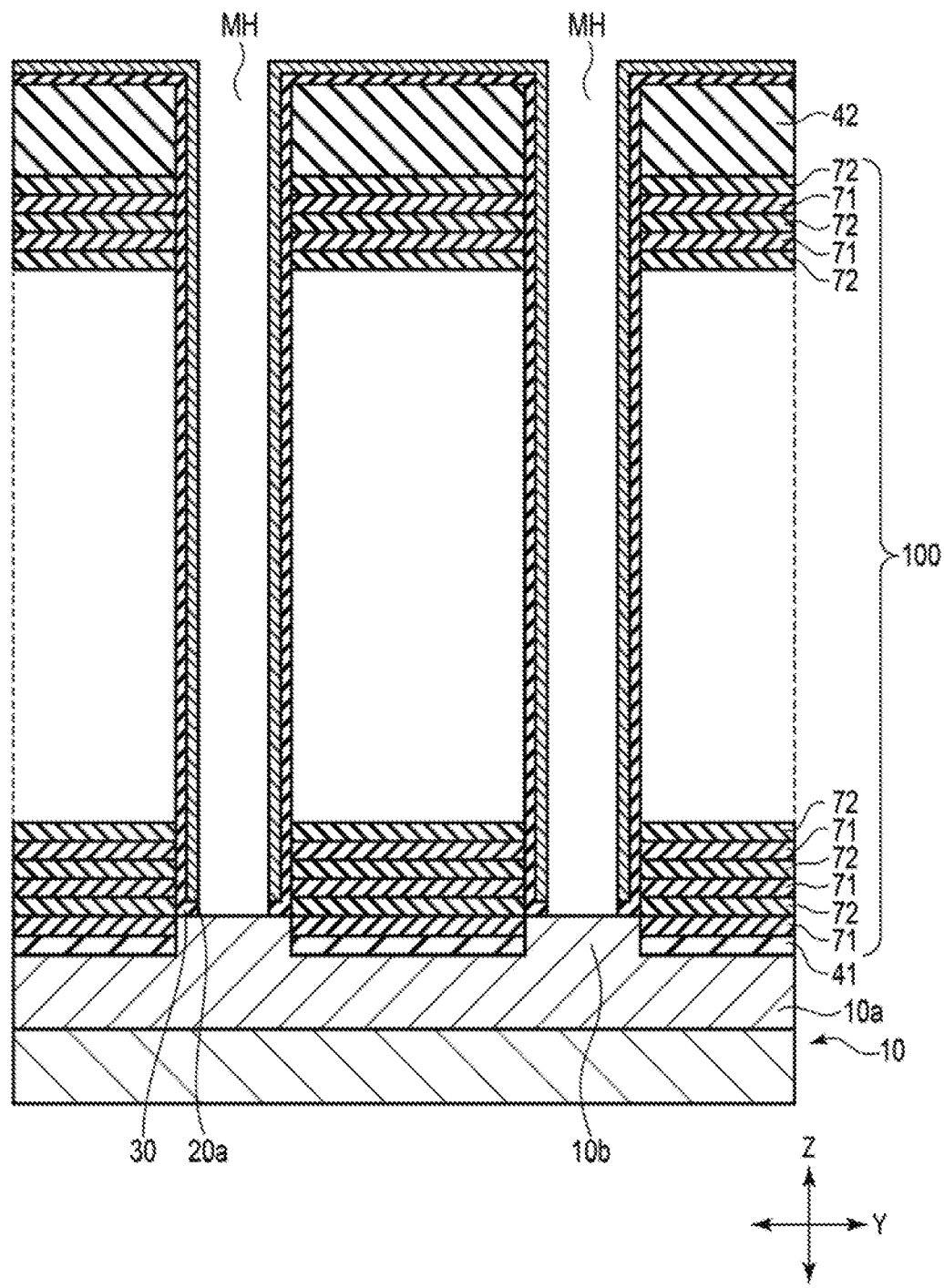
FIG. 13 is a sectional view illustrating a manufacturing process of the memory cell array in the semiconductor device according to the embodiment.

Next, as illustrated in FIG. 13, the cover layer 20a and the memory layer 30 deposited at the bottom of the memory hole MH are removed by the RIE method using a mask layer (not illustrated). Here, the memory layer 30 formed on the side surface of the memory hole MH is covered with the cover layer 20a and protected, and thus is not damaged by the RIE process.

Figure 14:
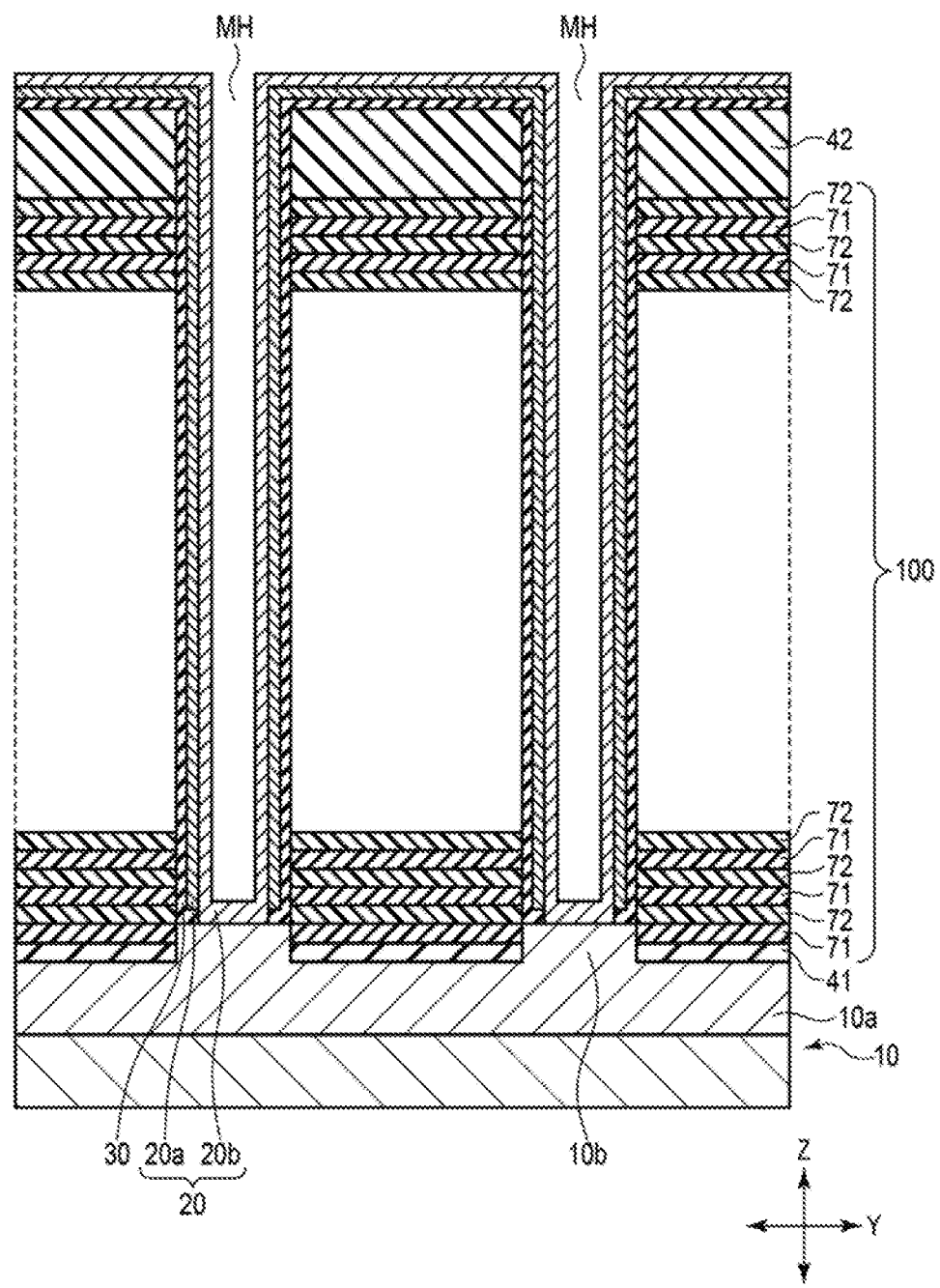
FIG. 14 is a sectional view illustrating a manufacturing process of the memory cell array in the semiconductor device according to the embodiment.

Next, as illustrated in FIG. 14, the body layer 20b is formed over the cover layer 20a within the memory hole MH. The body layer 20b is conformally formed on the side surface of the cover layer 20a within the memory hole MH, and on the portion of the substrate 10 exposed at the bottom of the memory hole MH. The lower end portion of the body layer 20b is in contact with the substrate 10. The body layer 20b is also formed on the cover layer 20a on the insulating layer 42.

The cover layer 20a and the body layer 20b are formed as, for example, amorphous silicon layers, and then crystallized into polycrystalline silicon (polysilicon) layers by heat treatment (annealing) to constitute the semiconductor layer 20.

Figure 15:
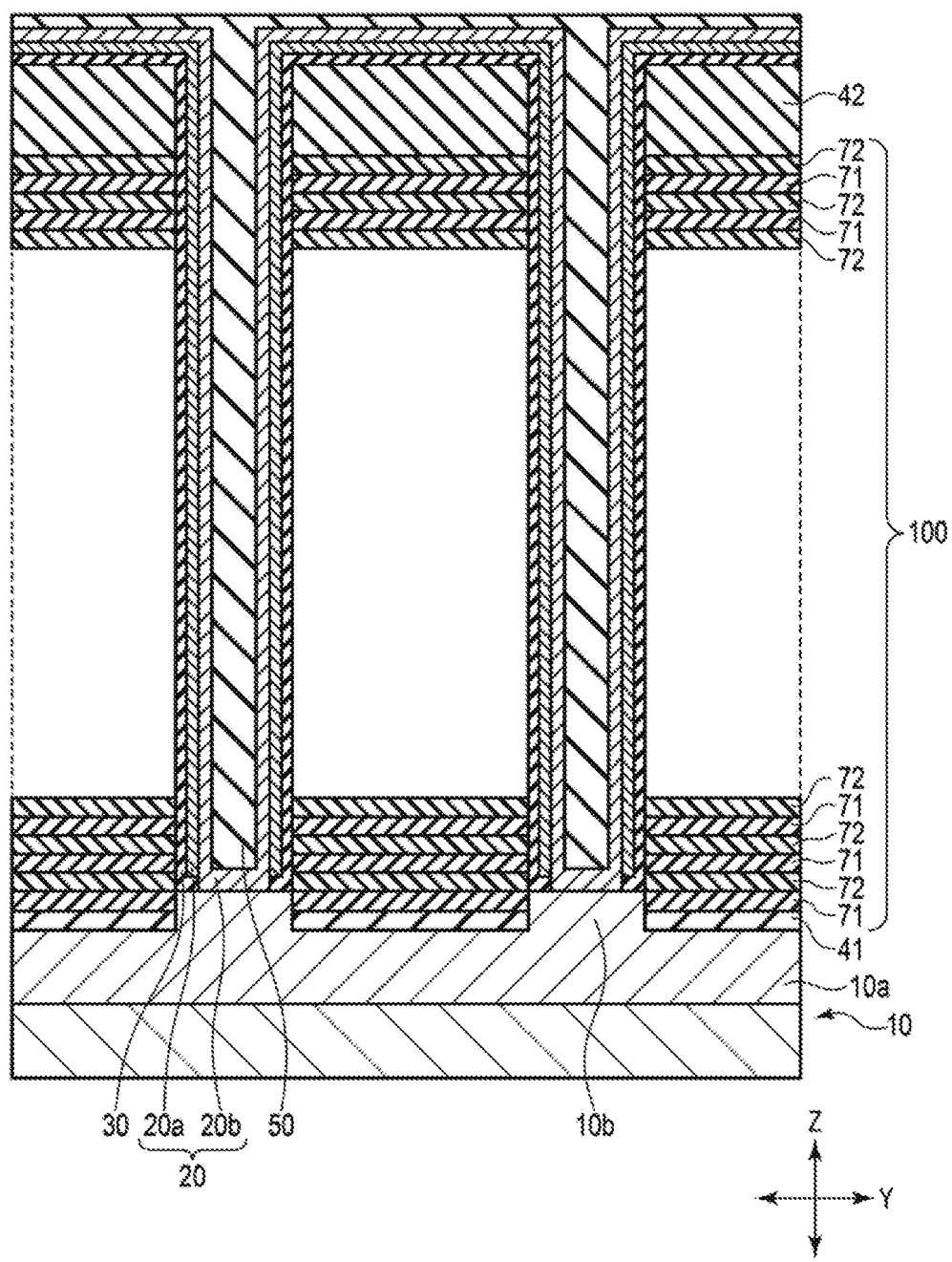
FIG. 15 is a sectional view illustrating a manufacturing process of the memory cell array in the semiconductor device according to the embodiment.

Next, as illustrated in FIG. 15, the core layer 50 is formed over the body layer 20b within the memory hole MH. Accordingly, the memory hole MH is filled with the material of the core layer 50. The core layer 50 is also formed on the body layer 20b on the insulating layer 42.

Figure 16:
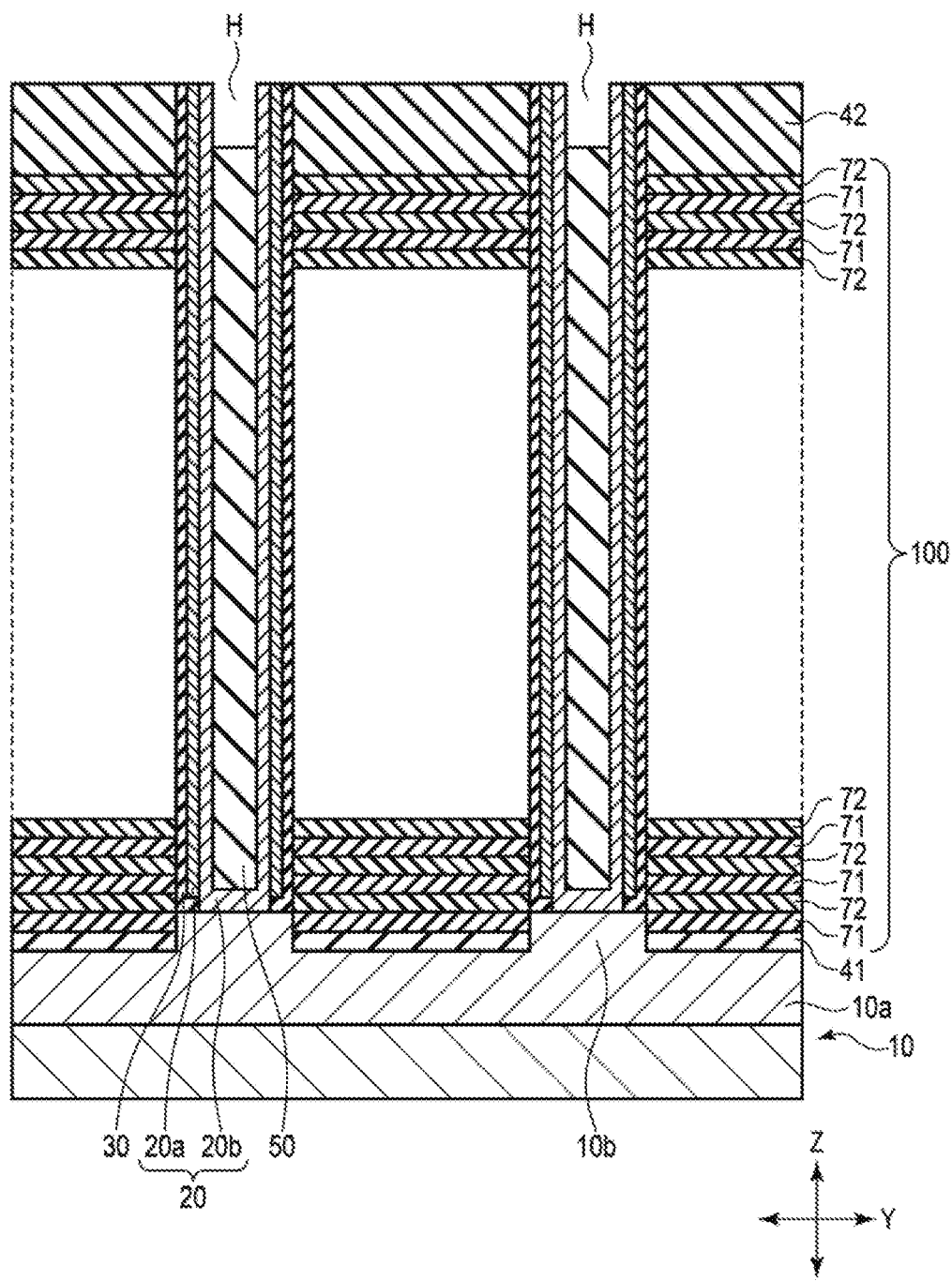
FIG. 16 is a sectional view illustrating a manufacturing process of the memory cell array in the semiconductor device according to the embodiment.

Next, as illustrated in FIG. 16, for example, the core layer 50, the body layer 20b, the cover layer 20a, and the memory layer 30 on the insulating layer 42 are removed by a chemical mechanical polishing (CMP) method.

Then, a portion of the core layer 50 in the upper end portion of the memory hole MH is removed by a RIE method using a mask layer (not illustrated). Accordingly, a hole H is formed extending inwardly of the memory hole MH where the core layer 50 was removed. Here, the upper surface of the core layer 50 is located at a position above, in the Z direction, the upper surface of the uppermost sacrificial layer 71.

Figure 17:
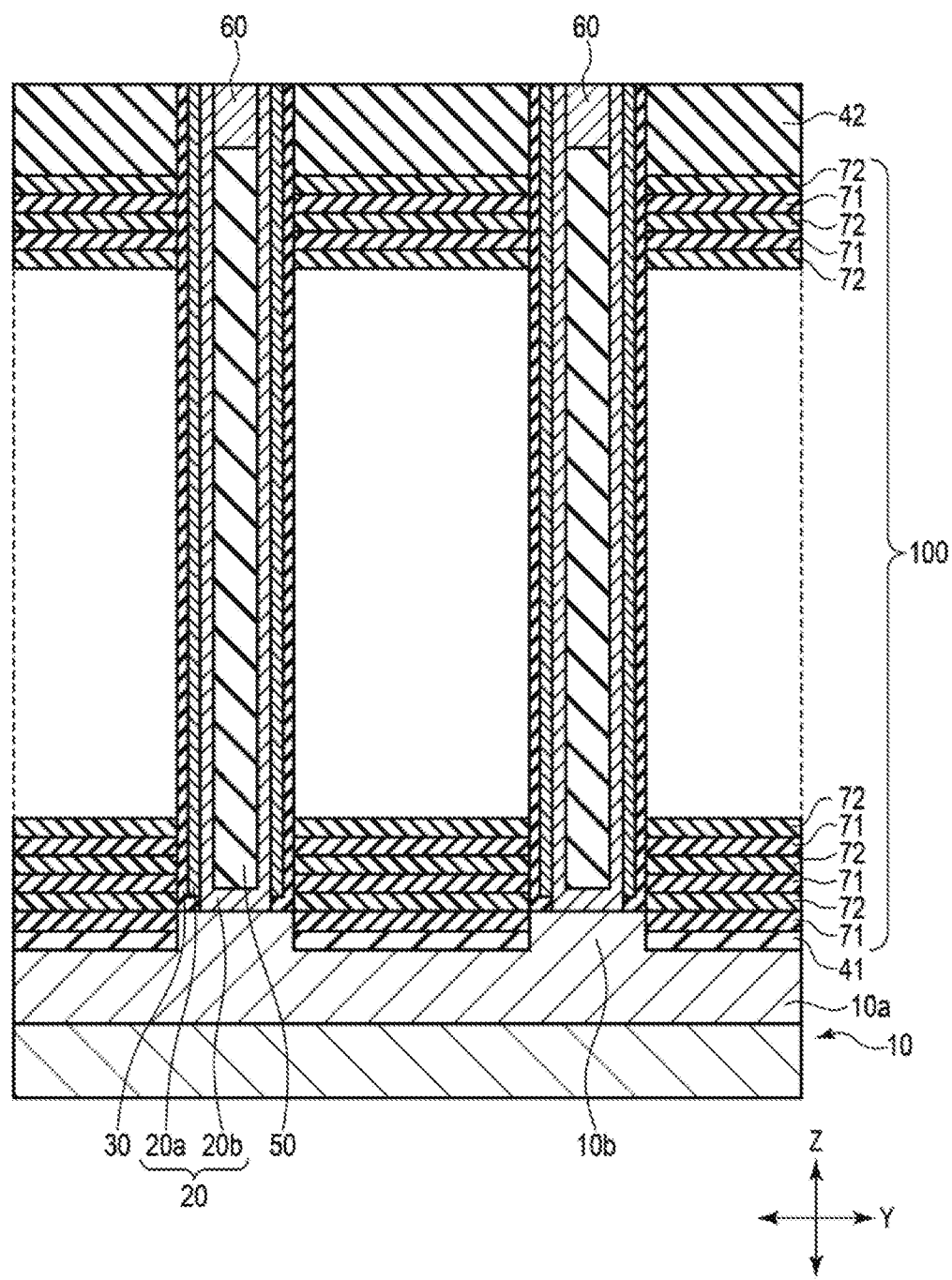
FIG. 17 is a sectional view illustrating a manufacturing process of the memory cell array in the semiconductor device according to the embodiment.

Next, as illustrated in FIG. 17, within the hole H, the semiconductor layer 60 is formed. In this manner, the plurality of columnar portions CL each of which includes the memory layer 30, the semiconductor layers 20 and 60, and the core layer 50 are formed within the stack 100. Hereinafter, a method of forming the semiconductor layer 60 will be described in detail.

Figure 18:
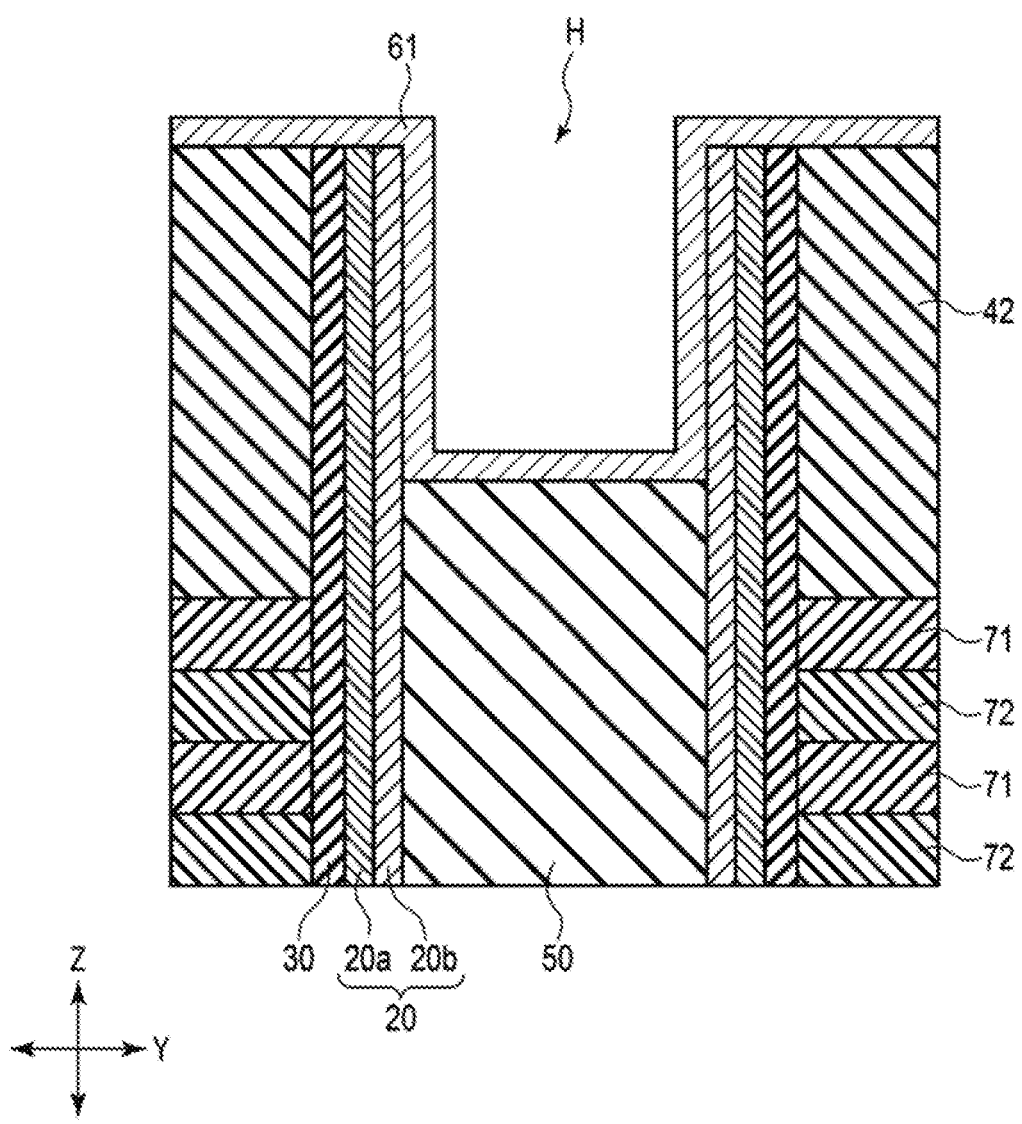
FIG. 18 is a sectional view illustrating a manufacturing process of the memory cell array in the semiconductor device according to the embodiment.

First, as illustrated in FIG. 18, the first semiconductor layer 61 is formed inside the semiconductor layer 20 within the hole H. The first semiconductor layer 61 is conformally formed on the side surface of the body layer 20b within the hole H, and on the core layer 50 exposed at the bottom in the hole H. That is, the first semiconductor layer 61 is formed to be in contact with the upper end portion of the body layer 20b. The first semiconductor layer 61 is also formed on the insulating layer 42.

The first semiconductor layer 61 is formed by, for example, a carbon doped chemical vapor deposition (CVD) method whereby carbon is incorporated into the semiconductor layer 61 as the layer 61 is deposited. Accordingly, the first semiconductor layer 61 is formed as an amorphous silicon layer containing carbon. Alternatively, after forming a semiconductor layer by the CVD method, the first semiconductor layer 61 is formed by implanting carbon into a semiconductor layer using an ion implantation method.

Figure 19:
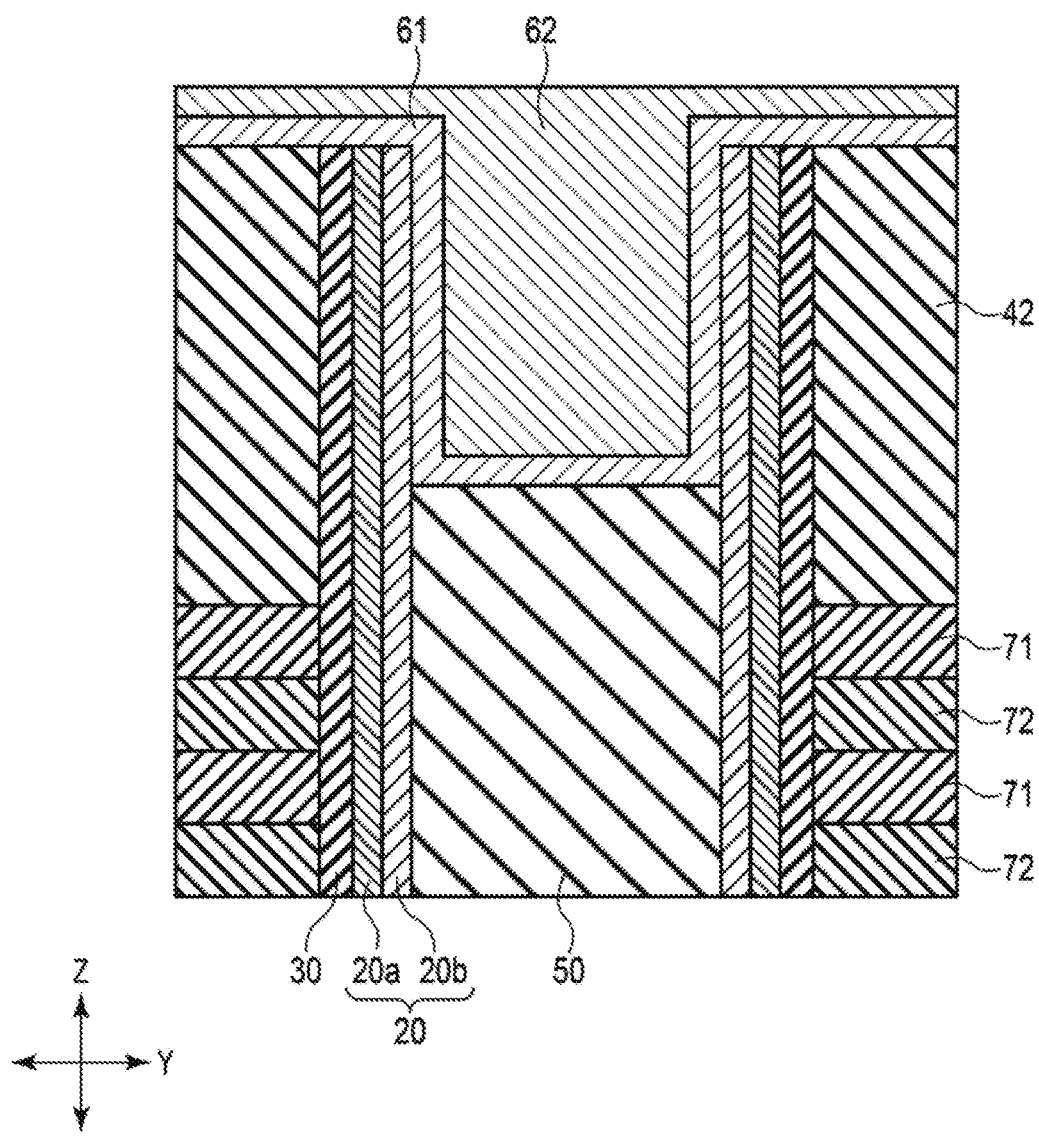
FIG. 19 is a sectional view illustrating a manufacturing process of the memory cell array in the semiconductor device according to the embodiment.

Next, as illustrated in FIG. 19, the second semiconductor layer 62 is formed over the first semiconductor layer 61 within the hole H by, for example, a CVD method. Accordingly, the hole H is filled. The second semiconductor layer 62 is also formed on the first semiconductor layer 61 on the insulating layer 42. The second semiconductor layer 62 is formed as an amorphous silicon layer.

Figure 20:
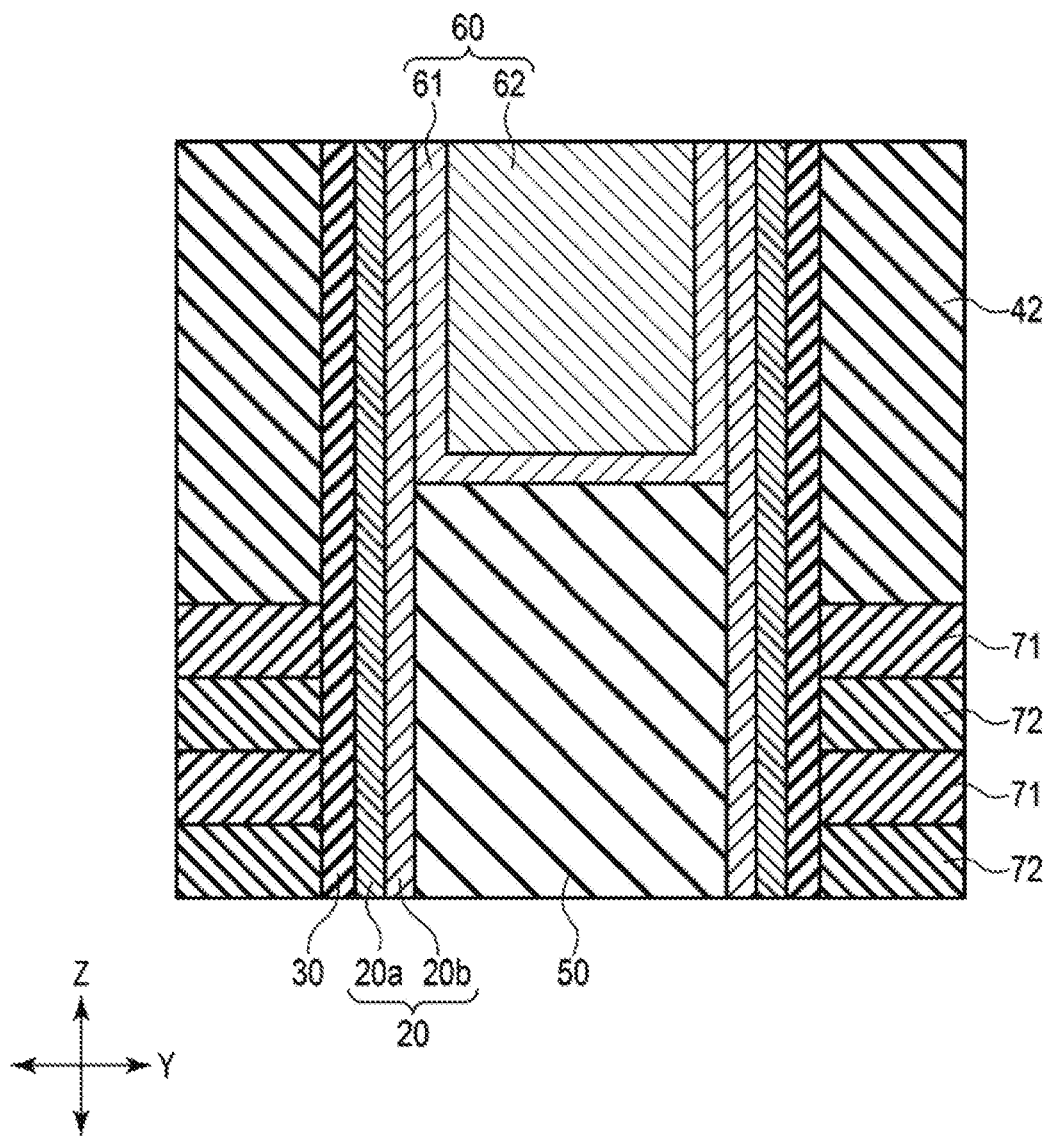
FIG. 20 is a sectional view illustrating a manufacturing process of the memory cell array in the semiconductor device according to the embodiment.

Next, as illustrated in FIG. 20, the second semiconductor layer 62 and the first semiconductor layer 61 on the insulating layer 42 are removed by, for example, a CMP method.

Thereafter, phosphorous is implanted as impurities into the second semiconductor layer 62 by an ion implantation method. Accordingly, the second semiconductor layer 62 is formed as an amorphous silicon layer containing phosphorous.

Boron may be implanted as impurities into the semiconductor layer 20 by an ion implantation method. Here, acceleration is higher in ion implantation of boron into the semiconductor layer 20 than in ion implantation of phosphorous into the second semiconductor layer 62.

Then, the first semiconductor layer 61 and the second semiconductor layer 62 are crystallized into polysilicon layers by annealing to constitute the semiconductor layer 60. Here, as illustrated in FIG. 5, the semiconductor layer 60 and the semiconductor layer 20 adjacent thereto may be formed as an integrated (continuous) polysilicon layer.

Next, a plurality of slits (shown in FIG. 1) are formed through the stack 100 by a RIE method using a mask layer. The slit extends through the stack 100 in the Z direction to reach the substrate 10.

Figure 21:
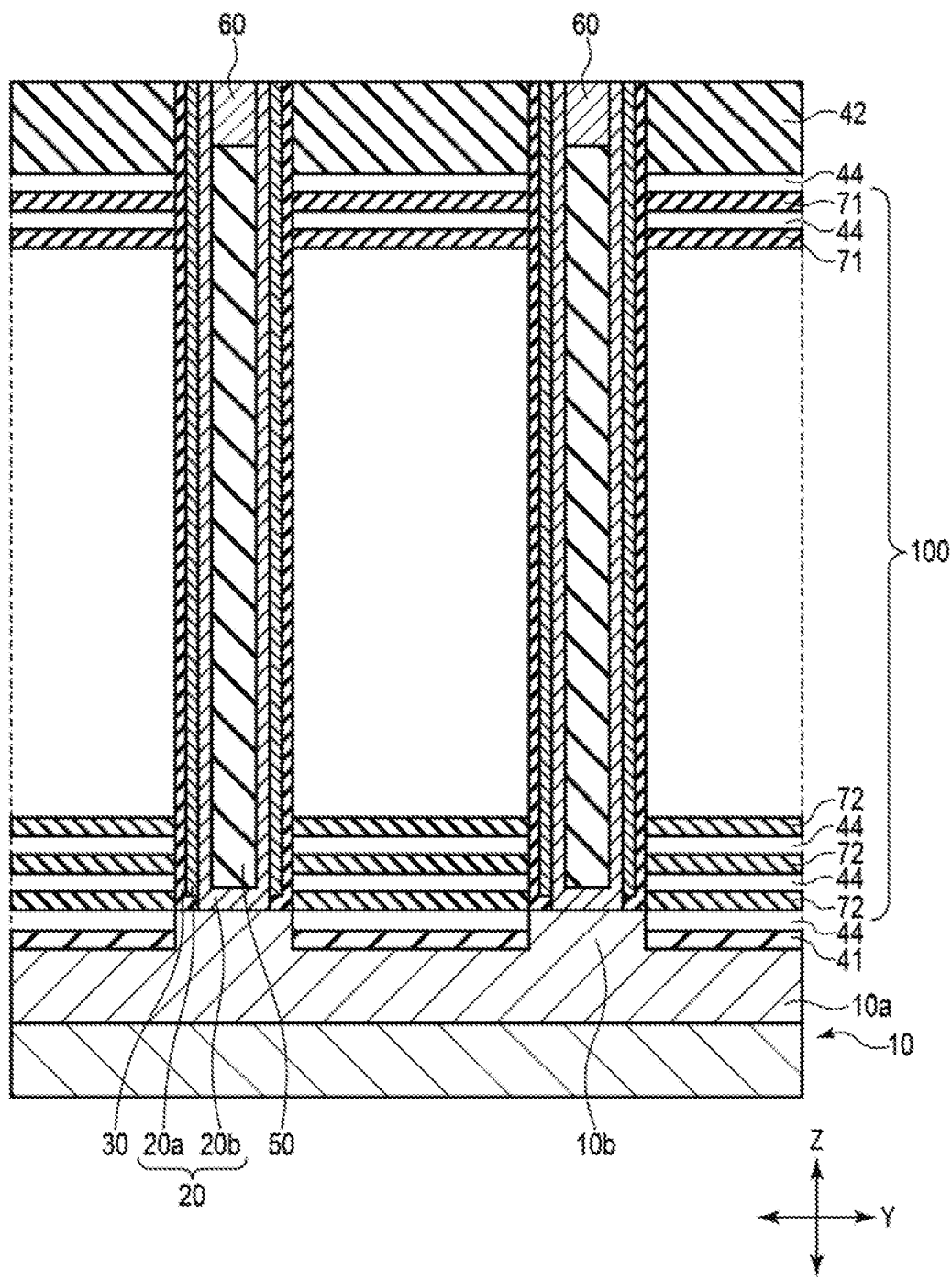
FIG. 21 is a sectional view illustrating a manufacturing process of the memory cell array in the semiconductor device according to the embodiment.

Then, as illustrated in FIG. 21, the sacrificial layers 71 are removed by an etchant or an etching gas supplied thereto through the slits. For example, as the etchant, an etchant containing phosphoric acid is used. Accordingly, voids 44 are formed between the insulating layers 72 which are vertically adjacent to each other in the Z direction. The void 44 is also formed between the insulating layer 41 and the lowermost insulating layer 72 of the stack 100, and between the insulating layer 42 and the uppermost insulating layer 72 of the stack 100.

The plurality of insulating layers 72 of the stack 100 are in contact with the side surfaces of the plurality of columnar portions CL and extend around the side surfaces of the columnar portions CL in the X direction Y direction plane. The plurality of insulating layers 72 are supported by physical coupling with the plurality of columnar portions CL, and the voids 44 between the insulating layers 72 are thus maintained open.

Next, as illustrated in FIG. 2, the side surface of the second portion 10b composed of silicon, which is exposed at the lowermost layer void 44 of the stack 100, is oxidized by, for example, a thermal oxidation method. Accordingly, an insulating layer integrated with the insulating layer 41 is formed on the side surface of the second portion 10b.

Then, the conductive layers 70 are formed in the voids 44 by, for example, a CVD method. Here, a source gas is supplied to the voids 44 through the slits.

Thereafter, although not illustrated, an insulating layer is formed on the side surface and the bottom of the slit. After the insulating layer formed on the bottom of the slit is removed by a RIE method, the wiring portion LI is embedded inside the insulating layer within the slit. The lower end portion of the wiring portion LI is in contact with the substrate 10.

In this manner, the semiconductor device according to the embodiment is formed.

Effect of Embodiment

In a NAND-type flash memory in which memory cells are three-dimensionally arranged, columnar portions constituting the memory cells are formed within a stack. Then, a contact is connected to the upper end of the columnar portion. A cap layer is provided at the upper end portion of the columnar portion to achieve electrical matching between the columnar portion and the contact. The cap layer is, for example, a semiconductor layer containing arsenic as impurities. However, when arsenic ions are implanted into the semiconductor layer, the implanted arsenic may damage (e.g., poison) the semiconductor layer and surrounding layers.

In contrast, as the cap layer a semiconductor layer containing phosphorous instead of arsenic can be used. When phosphorous ions are implanted into the semiconductor layer, damage to the semiconductor layer and surrounding layers may be reduced as compared to a case of arsenic. However, when phosphorous is used, phosphorous is diffused into the semiconductor layer forming a channel of the columnar portion through annealing in a manufacturing process. As a result, particularly, a threshold voltage of a drain side select transistor located at an upper layer portion is reduced, thereby deteriorating an electric characteristic.

In order to solve the above problems, according to the embodiment, as the cap layer, the first semiconductor layer 61 and the second semiconductor layer 62 are provided. The first semiconductor layer 61 is formed to cover the side surface and the bottom surface of the second semiconductor layer 62. The second semiconductor layer 62 is a silicon layer containing phosphorous (an amorphous silicon layer or a polysilicon layer), and the first semiconductor layer 61 is a silicon layer containing carbon. That is, the first semiconductor layer 61 containing carbon is provided between the second semiconductor layer 62 containing phosphorous and the semiconductor layer 20 serving as a channel. Accordingly, even when annealing is performed in the manufacturing process of the memory device, it is possible to prevent diffusion of phosphorous from the second semiconductor layer 62 to the semiconductor layer 20 by the first semiconductor layer 61. As a result, particularly, the threshold voltage of the drain side select transistor STD located at the upper layer portion may be prevented from being reduced, thereby preventing deterioration of an electric characteristic.

Application Example

Figure 22:
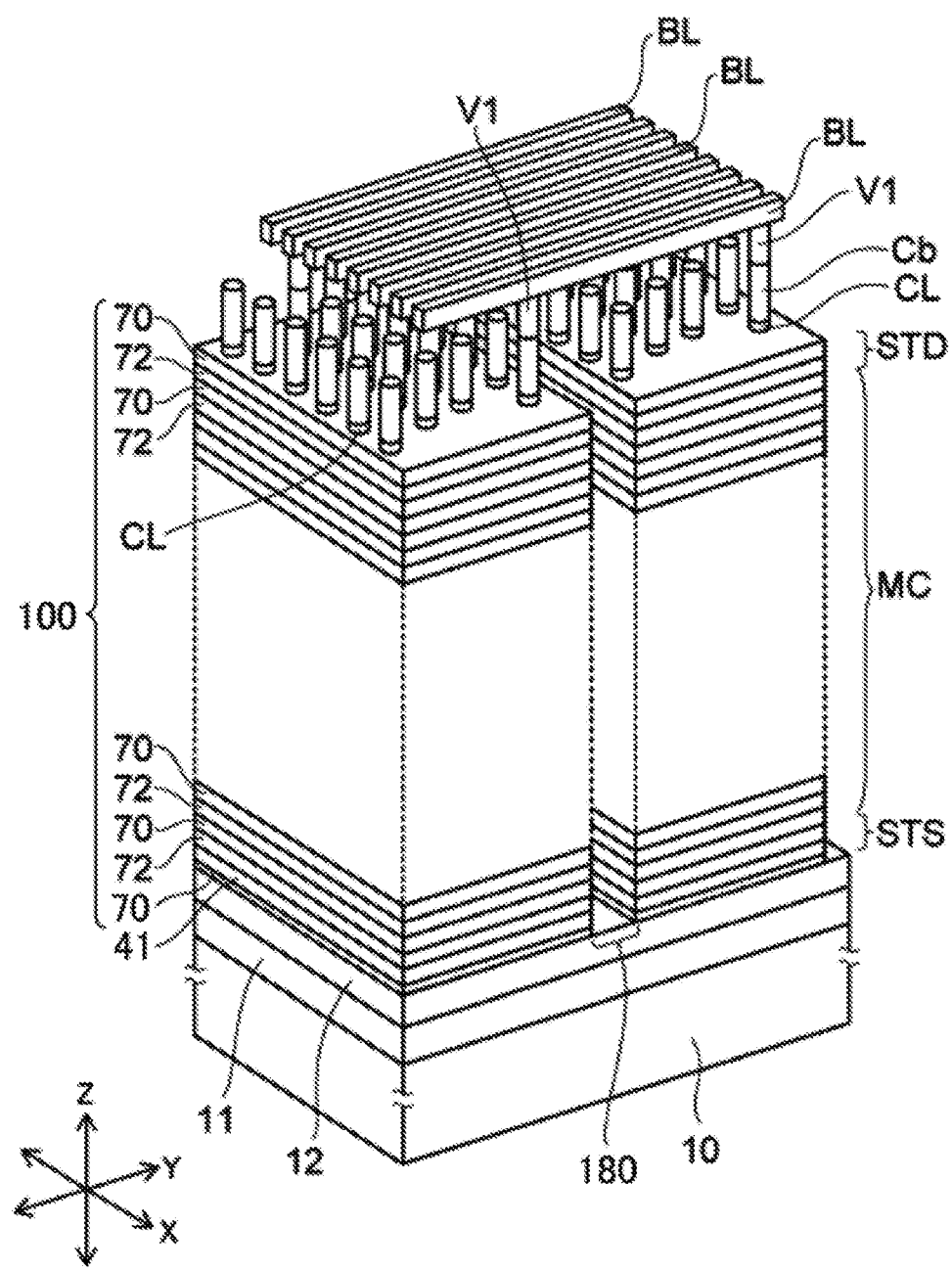
FIG. 22 is a perspective view illustrating another example of the memory cell array according to each embodiment.

FIG. 22 is a perspective view illustrating another example of the memory cell array 1 in each embodiment.

As illustrated in FIG. 22, in another example of the memory cell array 1, a first underlayer 11 and a second underlayer 12 are provided between a substrate 10 and a first stack 100a. The first underlayer 11 is provided between the substrate 10 and the second underlayer 12, and the second underlayer 12 is provided between the first underlayer 11 and the first stack 100a.

The second underlayer 12 is a semiconductor layer or a conductive layer. Otherwise, the second underlayer 12 may include a stack of the semiconductor layer and the conductive layer. The first underlayer 11 includes transistors and wiring which form a control circuit.

The lower end of the semiconductor layer 20 of the columnar portion CL is in contact with the second underlayer 12, and the second underlayer 12 is connected to a control circuit. Accordingly, the lower end of the semiconductor layer 20 of the columnar portion CL is electrically connected to the control circuit through the second underlayer 12. That is, the second underlayer 12 may be used as a source layer.

The stack 100 is separated into a plurality of blocks (or finger portions) in the Y direction by separation portions 160. The separation portion 160 is an insulating layer, and does not include wirings.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor device comprising:
   a stack comprising a plurality of conductive layers stacked and separated from each other in a first direction;
   an insulating layer provided above the stack;
   a columnar portion extending through the plurality of conductive layers and the insulating layer in the first direction;
   wherein the columnar portion includes a core layer extending through at least one of the conductive layers in the first direction, a first semiconductor layer located between the core layer and the plurality of conductive layers, a memory layer located between the first semiconductor layer and the plurality of conductive layers, and a second semiconductor layer that is located above the core layer and contacts the first semiconductor layer, and
   wherein the second semiconductor layer includes a first region containing phosphorous, and a second region that contains carbon and phosphorous, and
   the second region includes a first sub-region provided between the core layer and the first region of the second semiconductor layer in the first direction and a second sub-region provided between the insulating layer and the first region of the second semiconductor layer.

2. The semiconductor device according to claim 1, wherein the first semiconductor layer contains carbon, and a carbon concentration in the first semiconductor layer is lower than a carbon concentration in the second region of the second semiconductor layer.

3. The semiconductor device according to claim 2, wherein the carbon concentration in the first semiconductor layer decreases along the first direction as being distant away from the first sub-region of the second semiconductor layer.

4. The semiconductor device according to claim 1, wherein the first region of the second semiconductor layer contains carbon, and a carbon concentration in the first region of the second semiconductor layer is lower than a carbon concentration in the second region of the second semiconductor layer.

5. The semiconductor device according to claim 4, wherein the carbon concentration in the first region of the second semiconductor layer decreases in the first direction as being distant away from the first sub-region of the second semiconductor layer.

6. The semiconductor device according to claim 1, further comprising a contact contacting the second semiconductor layer.

7. The semiconductor device according to claim 1, wherein
   the stack is provided on a substrate, and
   a lowermost surface of the second semiconductor layer is farther from the substrate in the first direction than is an upper surface of the uppermost one of the conductive layers in the stack from the substrate in the first direction.

8. The semiconductor device according to claim 1, wherein the carbon concentration in the first region of the second semiconductor layer decreases along a second direction that is perpendicular to the first direction as being distant away from the second sub-region of the second semiconductor layer.

9. The semiconductor device according to claim 1, wherein a side surface of the second sub-region of the second semiconductor layer is in contact with the first semiconductor layer.

10. The semiconductor device according to claim 1, wherein a side surface of the second sub-region of the second semiconductor layer is in contact with the memory layer.

11. The semiconductor device according to claim 1, wherein a bottom surface of the second sub-region of the second semiconductor layer is in contact with the first semiconductor layer.

* * * * *